US008153188B2

(12) United States Patent
Fukuzawa et al.

(10) Patent No.: US 8,153,188 B2
(45) Date of Patent: Apr. 10, 2012

(54) METHOD AND APPARATUS FOR MANUFACTURING MAGNETORESISTIVE ELEMENT

(75) Inventors: Hideaki Fukuzawa, Sagamihara (JP); Katsuhiko Koui, Yokohama (JP); Hiromi Yuasa, Yokohama (JP); Susumu Hashimoto, Ebina (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 12/248,578

(22) Filed: Oct. 9, 2008

(65) Prior Publication Data

US 2009/0061105 A1    Mar. 5, 2009

Related U.S. Application Data

(62) Division of application No. 11/199,448, filed on Aug. 9, 2005, now Pat. No. 7,514,117.

(30) Foreign Application Priority Data

Aug. 10, 2004 (JP) ................................. 2004-233641

(51) Int. Cl.
  *G11B 5/127* (2006.01)
  *G11B 5/00* (2006.01)
  *G11B 5/62* (2006.01)
  *H05H 1/00* (2006.01)

(52) U.S. Cl. ........ 427/127; 427/539; 427/533; 427/535; 427/130; 427/131

(58) Field of Classification Search ................ 427/539, 427/533, 535, 127–131
See application file for complete search history.

(56) References Cited

U.S. PATENT DOCUMENTS

| 7,116,529 | B2 | 10/2006 | Yoshikawa et al. |
| 7,223,485 | B2 | 5/2007 | Yuasa et al. |
| 7,331,100 | B2 | 2/2008 | Li et al. |
| 7,390,529 | B2 | 6/2008 | Li et al. |
| 2002/0048127 | A1 | 4/2002 | Fukuzawa et al. |
| 2002/0048128 | A1 | 4/2002 | Kamiguchi et al. |
| 2002/0054461 | A1 | 5/2002 | Fujiwara et al. |

(Continued)

FOREIGN PATENT DOCUMENTS

CN    1431651    7/2003

(Continued)

OTHER PUBLICATIONS

Hideaki Fukuzawa, et al. "MR Ratio Enhancement by NOL Current-Confined-Path Structures in CPP Spin Valves", IEEE Transactions on Magnetics, Jul. 2004, vol. 40, No. 4, pp. 2236-2238.

(Continued)

*Primary Examiner* — Timothy Meeks
*Assistant Examiner* — Mandy Louie
(74) *Attorney, Agent, or Firm* — Oblon, Spivak, McClelland, Maier & Neustadt, L.L.P.

(57) ABSTRACT

The present invention relates to a method for manufacturing a magnetoresistive element having a magnetization pinned layer, a magnetization free layer, and a spacer layer including an insulating layer provided between the magnetization pinned layer and the magnetization free layer and current paths penetrating into the insulating layer. A process of forming the spacer layer in the method includes depositing a first metal layer forming the metal paths, depositing a second metal layer on the first metal layer, performing a pretreatment of irradiating the second metal layer with an ion beam or a RF plasma of a rare gas, and converting the second metal layer into the insulating layer by means of supplying an oxidation gas or a nitriding gas.

12 Claims, 12 Drawing Sheets

U.S. PATENT DOCUMENTS

| | | |
|---|---|---|
| 2002/0114974 A1 | 8/2002 | Carey et al. |
| 2003/0099868 A1* | 5/2003 | Tanahashi et al. ..... 428/694 TM |
| 2003/0123200 A1 | 7/2003 | Nagasaka et al. |
| 2004/0021990 A1* | 2/2004 | Koui et al. ................. 360/324.1 |

FOREIGN PATENT DOCUMENTS

| | | | |
|---|---|---|---|
| EP | 1 400 957 A2 | | 3/2004 |
| JP | 2002-76473 | | 3/2002 |
| JP | 2002-208744 | | 7/2002 |
| JP | 2004-153248 | | 5/2004 |
| JP | 2004-214234 | * | 7/2004 |
| JP | 2005-339784 | | 12/2005 |
| WO | WO 03/032338 A1 | | 4/2003 |

OTHER PUBLICATIONS

Partial Machine Translation of JP 2004-153248; JPO; 54 pages.

* cited by examiner

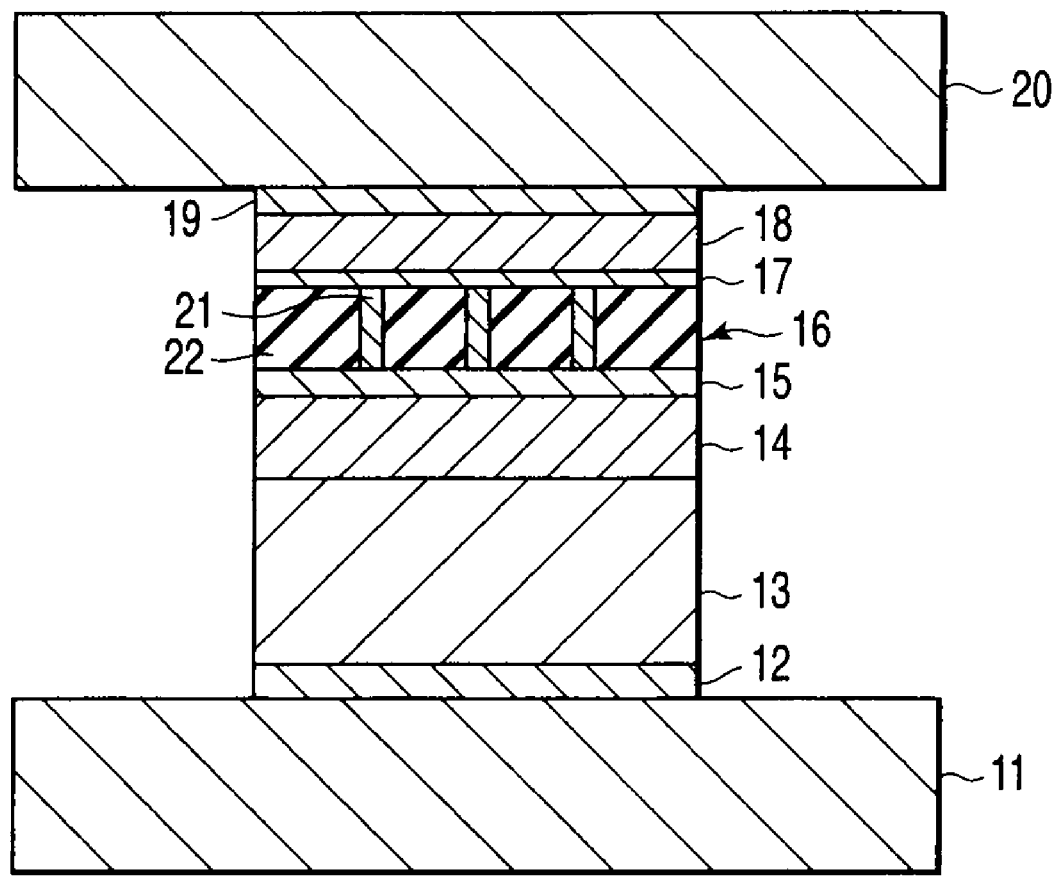
F I G. 1

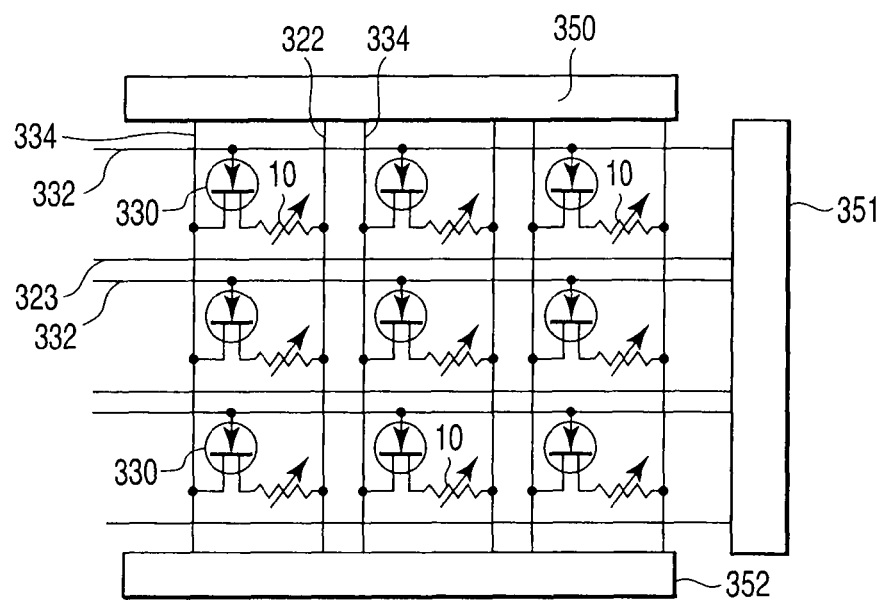
F I G. 17
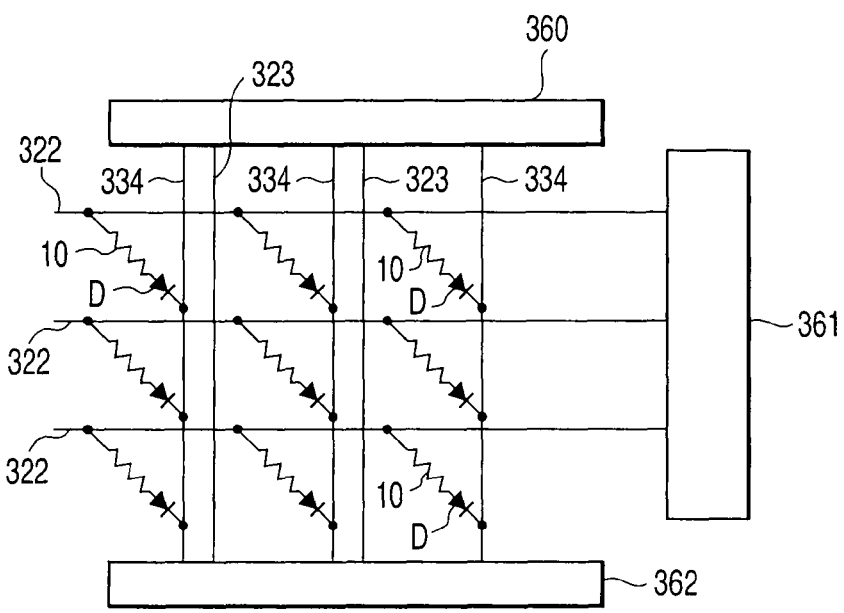
F I G. 18

METHOD AND APPARATUS FOR MANUFACTURING MAGNETORESISTIVE ELEMENT

CROSS-REFERENCE TO RELATED APPLICATIONS

This application is a divisional of U.S. application Ser. No. 11/199,448 filed Aug. 9, 2005, and is based upon and claims the benefit of priority from prior Japanese Patent Application No. 2004-233641, filed Aug. 10, 2004, the entire contents of each of which are incorporated herein by reference.

BACKGROUND OF THE INVENTION

1. Field of the Invention

The present invention relates to a method and apparatus for manufacturing a magnetoresistive element having a structure in which a current is supplied perpendicularly to the plane of the element.

2. Description of the Related Art

The performance of magnetic devices, particularly magnetic heads, has been drastically improved by the discovery of the giant magnetoresistive effect (GMR). Specifically, application of a spin-valve film (SV film) to magnetic heads and magnetic random access memories (MRAMs) has brought about marked technical improvement in the field of magnetic devices.

The "spin-valve film" is a stacked film having a structure in which a nonmagnetic metal spacer layer is sandwiched between two ferromagnetic layers. In the spin-valve film, the magnetization of one ferromagnetic layer (referred to as a "pinned layer" or "magnetization pinned layer") is pinned by an antiferromagnetic layer or the like, whereas the magnetization of the other ferromagnetic layer (referred to as a "free layer" or "magnetization free layer") is made rotatable in accordance with an external field (for example, a media field). In the spin-valve film, a giant magnetoresistace change can be produced by a change of the relative angle between the magnetization directions of the pinned layer and the free layer.

Conventional spin-valve films are current-in-plane (CIP)-GMR elements in which a sense current is supplied parallel to the plane of the element. In recent years, much attention has been paid to current-perpendicular-to-plane (CPP)-GMR elements in which a sense current is supplied substantially perpendicular to the plane of the element because the CPP-GMR elements exhibit a greater GMR effect than the CIP-GMR elements.

When such a magnetoresistive element is applied to a magnetic head, a higher element resistance poses problems in regard to shot noise and high frequency response. It is appropriate to evaluate the element resistance in terms of RA (a product of the resistance and the area). Specifically, RA must be several hundred $\Omega\mu m^2$ to $1\ \Omega\mu m^2$ at a recording density of 200 Gbpsi (gigabits per square inch) and less than 500 $\Omega\mu m^2$ at a recording density of 500 Gbpsi.

In connection with these requirements, the CPP element has a potential to provide a high MR ratio even though it exhibits a low resistance on a trend of increasingly reducing the size of the magnetic device. Under the circumstances, the CPP element and the magnetic head using the same are expected to be promising candidates to achieve a recording density of 200 Gbpsi to 1 Tbpsi (terabits per square inch).

However, a metal CPP element in which the pinned layer, the spacer layer and the free layer (this three-layer structure is referred to as a spin-dependent scattering unit) are made of metal exhibits only a low resistance change rate. Accordingly, the metal CCP element is insufficient to sense very weak fields resulting from an increased density and is thus hard to put to practical use.

To solve this problem, a CPP element has been proposed which uses, as a nonmagnetic spacer layer, a nano-oxide layer (NOL) containing current paths extending across the thickness of the element (see, for example, Jpn. Pat. Appln. KOKAI Publication No. 2002-208744). Such a CPP element can increase both the element resistance and the MR ratio due to a current-confined-path (CCP) effect. Such an element is referred to as a CCP-CPP element hereinafter. Incidentally, a method for forming a layer mainly composed of an oxide in a magnetoresistive element has already been proposed (see Jpn. Pat. Appln. KOKAI Publication No. 2002-76473).

Compared to the metal CPP element, the CCP-CPP element has the following improvement effect. A metal CPP element was produced which had the structure of substrate/Ta [5 nm]/Ru [2 nm]/PtMn [15 nm]/$Co_{90}Fe_{10}$ [4 nm]/Ru [0.9 nm]/$Co_{90}Fe_{10}$ [4 nm]/Cu [5 nm]/$Co_{90}Fe_{10}$ [1 nm]/$Ni_{81}Fe_{19}$ [3 nm]/Cu [1 nm]/Ta cap layer. Ordering heat treatment for pinning the pinned layer by PtMn was carried out in a magnetic field at 270° C. for 10 hours. On the other hand, a CCP-CPP element having, as a spacer layer, a NOL formed by naturally oxidizing $Al_{90}Cu_{10}$ [0.7 nm], instead of the Cu spacer layer in the metal CPP element, was produced. The area resistances RA, the changes of the area resistance ΔRA, and MR ratios of these elements are shown below.

|  | metal CPP | CCP-CPP |
|---|---|---|
| RA | 100 m$\Omega\mu m^2$ | 370 m$\Omega\mu m^2$ |
| ΔRA | 0.5 m$\Omega\mu m^2$ | 5.6 m$\Omega\mu m^2$ |
| MR ratio | 0.5% | 1.5% |

As described above, the CCP-CPP element exhibits an improved MR ratio and an improved RA and thus has ΔRA one order of magnitude higher than the metal CPP element.

However, in spite of their good characteristics shown above, the CCP-CPP element is supposed insufficient to sense very weak field signals from a media with a high recording density of 200 to 500 Gbpsi. A trial calculation indicates that the MR ratio must be at least 3% at, for example, a recording density of 200 Gbpsi and RA of 500 m$\Omega\mu m^2$. In order to obtain a sufficient signal-to-noise ratio, it is necessary to provide an MR ratio of at least 7%, that is, at least double the trial calculation. In view of these indices, the above value of the MR ratio is about half the required specification. Thus, it is difficult to put these elements to practical use.

BRIEF SUMMARY OF THE INVENTION

According to an aspect of the present invention, there is provided a method for manufacturing a magnetoresistive element comprising a magnetization pinned layer a magnetization direction of which is substantially pinned in one direction, a magnetization free layer a magnetization direction of which varies depending on an external field, and a spacer layer including an insulating layer provided between the magnetization pinned layer and the magnetization free layer and current paths penetrating into the insulating layer, the method comprising: depositing a second metal layer on a first metal layer; and causing the first metal layer to penetrate into the second metal layer as the metal paths and converting the second metal layer into the insulating layer by means of supplying an oxidation gas or a nitriding gas.

In the method according to an aspect of the present invention may further comprise: performing a pretreatment of irradiating the second metal layer with an ion beam or a RF plasma of a rare gas prior to the converting step.

According to another aspect of the present invention, there is provided a method for manufacturing a magnetoresistive element comprising a magnetization pinned layer a magnetization direction of which is substantially pinned in one direction, a magnetization free layer a magnetization direction of which varies depending on an external field, and a spacer layer including an insulating layer provided between the magnetization pinned layer and the magnetization free layer and current paths penetrating into the insulating layer, the method comprising a process of forming the spacer layer comprising: depositing a first metal layer forming the metal paths; depositing a second metal layer on the first metal layer; performing a pretreatment of irradiating the second metal layer with an ion beam or a RF plasma of a rare gas; and converting the second metal layer into the insulating layer by means of supplying an oxidation gas or a nitriding gas.

According to still another aspect of the present invention, there is provided an apparatus for manufacturing a magnetoresistive element using the above method, the apparatus comprising: a load lock chamber to which a substrate is loaded; a depositing chamber in which a metal layer is deposited on the substrate; a reaction chamber comprising a supplier supplying an oxidation gas or a nitriding gas and an ion source which excites a rare gas to generate plasma and irradiates the metal layer with an ion beam; and a substrate transfer chamber connected to the chambers via vacuum valves.

BRIEF DESCRIPTION OF THE SEVERAL VIEWS OF THE DRAWING

FIG. 1 is a cross-sectional view of a CCP-CPP element according to an embodiment of the present invention;

FIGS. 9A to 9C are a perspective view of the CCP-CPP element according to Example 2, an enlarged perspective view of a current path, and an equivalent circuit diagram of the CCP-CPP element;

FIG. 17 is a diagram showing an example of the matrix configuration of a magnetic memory according to an embodiment of the present invention;

FIG. 18 is a diagram showing another example of the matrix configuration of a magnetic memory according to an embodiment of the present invention;

DETAILED DESCRIPTION OF THE INVENTION

Figure 2A:
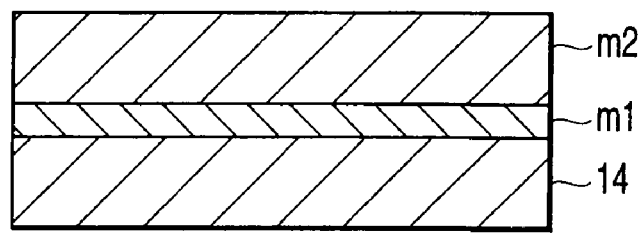
FIGS. 2A to 2D are cross-sectional views schematically illustrating a method for manufacturing the CCP-CPP element according to the embodiment of the present embodiment.

FIG. 1 shows a cross-sectional view of a magnetoresistive element (CCP-CPP element) according to an embodiment of the present invention. The magnetoresistive element shown in FIG. 1 has a lower electrode 11, an underlayer 12, a pinning layer 13, a pinned layer 14, a metal layer 15, a spacer layer (CCP-NOL) 16, a metal layer 17, a free layer 18, a cap layer 19, and an upper electrode 20; all these layers are formed on a substrate (not shown). The spacer layer (CCP-NOL) 16 includes an insulating layer 22 and current paths 21 penetrating the insulating layer 22.

With reference to FIGS. 2A to 2D, of a method for manufacturing the magnetoresistive element (CCP-CPP element) according to the embodiment of the present invention will be briefly described. Here, an example in which the spacer layer 16 including the current paths 21 made of Cu are formed in the insulating layer 22 made of $Al_2O_3$ will be described.

As shown in FIG. 2A, a lower electrode, an underlayer, and a pinning layer (these members are not shown) are formed on a substrate, and then a pinned layer 14 is deposited on the pinning layer. A first metal layer m1 (for example, Cu) that forms current paths is deposited on the pinned layer. A second metal layer m2 (for example, AlCu or Al) to be converted into an insulating layer is deposited on the first metal layer m1.

Figure 2B:
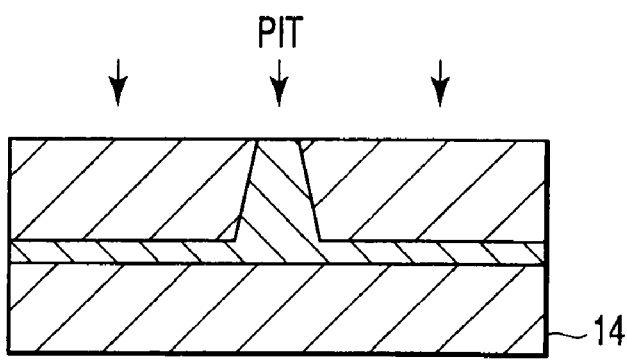

As shown in FIG. 2B, a pretreatment is performed by irradiating the second metal layer m2 with an ion beam of rare gas (for example, Ar). This pretreatment is referred to as a pre-ion treatment (PIT). The PIT causes the first metal layer m1 to be partly sucked up in the second metal layer m2 by which a part of m1 intrudes into m2.

Figure 2C:
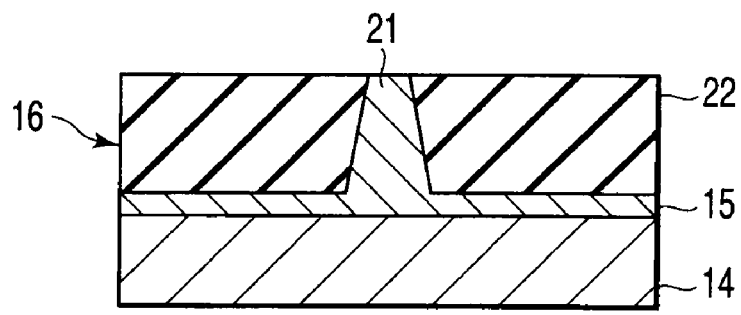

As shown in FIG. 2C, an oxidation gas (for example, oxygen) is supplied to oxidize the second metal layer m2. The oxidation converts the second metal layer m2 into an insulating layer 22 made of $Al_2O_3$, and also forms current paths 21 penetrating the insulating layer 22, thereby forming a spacer layer 16.

Figure 2D:
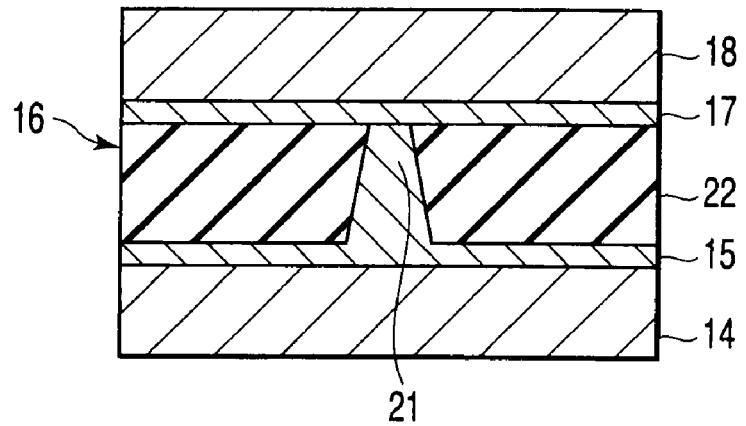

As shown in FIG. 2D, a metal layer 17 such as Cu is deposited on the spacer layer 16, and a free layer 18 is deposited on the metal layer 17. The metal layer 17 on the spacer layer 16 has a function for preventing the free layer, formed on the metal layer, from being affected by oxidation and a function of improving crystallinity of the free layer. For example, when the insulating layer 22 is formed of amorphous $Al_2O_3$, the crystallinity of the metal layer formed thereon tends to be degraded. However, if a layer having a function of improving the crystallinity of the free layer such as a Cu layer is provided on the insulating layer 22, even if the thickness of the Cu layer is only several angstrom, the crystallinity of the free layer would be significantly improved. It should be noted that the metal layer 17 need not necessarily be provided in some cases depending on the materials of the spacer layer 16 and the free layer 18.

The method according to the embodiment of the present invention improves the purity of the current paths 21, which penetrate the insulating layer 22 in the spacer layer 16. This in turn makes it possible to manufacture a magnetoresistive element with a high MR ratio without significantly increasing the area resistance RA.

The above processes will now be described in more detail.

In FIG. 2B, the pretreatment (PIT) is the most important and characteristic step in the method of the present invention; the pretreatment (PIT) is performed after the deposition of the first and second metal layers m1 and m2 on the pinned layer 14 and before oxidation, in order to allow a part of the first metal layer m1 to intrude into the second metal layer m2 to form current paths.

In the PIT process, the second metal layer m2 is irradiated with an ion beam of rare gas; the second metal layer m2 is to be converted into the insulating layer 22 in the spacer layer 16. The rare gas includes Ar, Kr, He, and Xe. Ar is most desirable in terms of manufacturing costs. In place of Ar, another rare gas having a larger mass such as Xe may be used as required to produce a specific effect.

Preferable conditions set for irradiation with an ion beam in the PIT process are an acceleration voltage V+ of 30 to 130 V, a beam current Ib of 20 to 200 mA, and an RF power of 10 to 300 W, a RF power inducing plasma in an ion source in order to maintain the beam current at a constant value. These conditions are significantly weaker than those for ion beam etching. This is because marked etching during the PIT process may eliminate the second metal layer (AlCu or Al) to be oxidized.

An alternative method is conceivable in which a second metal layer with a thickness larger than a desired thickness is deposited taking the thickness of an etched part of 20 Å or more into account, followed by performing an ion beam treatment under conditions more intensive than those described above to leave a partly etched second metal layer having the desired thickness. However, this method is not so preferable. This is because the intensive conditions for the ion beam treatment make uniform control difficult to vary etching across the thickness of the metal film depending on a position in the film surface, thus possibly damaging the pinned layer. The main purpose of the PIT treatment is absolutely to cause suction of the metal layer m1. Thus, decrease in the thickness of the metal layer m2 is a very small amount with a typical value of 0 to 3 Å, which is different from the case of etching.

The incident angle of the ion beam is varied between 0 and 80°; the incident angle is defined to be 0° when the beam is perpendicular to the film surface upon incidence and to be 90° when the beam is parallel to the film surface upon incidence. The treatment time required for the PIT process is preferably about 15 to 180 seconds and more preferably 30 seconds or more in terms of controllability and the like. A longer treatment time is not preferable because it degrades the productivity for the CCP-CPP element. In these regards, the treatment time is most preferably with in a range between about 30 and 180 seconds.

As shown in FIG. 2B, the PIT process causes the Cu of the first metal layer to be sucked up in the second metal layer by which Cu intrudes into the second metal layer. The Cu of the first metal layer has a protruded shape penetrating into the second metal layer, which remains as a metal layer without being converted into an insulation layer after the later oxidation treatment and forms current paths. As described above, the second metal layer may be AlCu or Al. If an AlCu alloy is used as a second metal layer, not only suction of Cu of the first metal layer but also a phase separation phenomenon occurs, resulting in separation of Al and Cu from the AlCu alloy. If Al free from Cu is used as a second metal layer, only suction of Cu of the first metal layer occurs. In this manner, the PIT process causes Cu of the first metal layer to be sucked up in the second metal layer. Accordingly, a metal other than Al can be used for the second metal layer. The second metal layer may be, for example, Si, Hf, Zr, Mg, W, Mo, Nb, Cr, Ti, or an alloy containing these elements, which is easily converted into a stable oxide. Thus, the PIT process, that is a type of energy treatment, enables the first metal layer to be sucked up in the second metal layer.

As shown in FIG. 2C, an oxidation treatment is performed after PIT. This process utilizes a difference in oxidation energy that Al is readily oxidized but Cu is not. Thus, a spacer layer is formed in which Cu forming the current paths is separated from the insulating layer of $Al_2O_3$. The oxidation method may be natural oxidation or a method supplying an oxidation gas (for example, oxygen) while irradiating with an ion beam of rare gas. The latter method is more preferable and is referred to as ion beam-assisted oxidation (IAO). The rare gas includes Ar, Xe, Kr, and He.

Preferable conditions set for irradiation with an ion beam in the IAO process are an acceleration voltage V+ of 40 to 200 V, a beam current Ib of 30 to 200 mA, and an RF power of 20 to 400 W, the RF power inducing plasma in an ion source in order to maintain the beam current at a constant value. The IAO treatment time is preferably about 15 to 300 seconds and more preferably about 20 to 180 seconds. The treatment time is reduced when a stronger ion beam is used and increased when a weaker ion beam is used.

The preferable range of the amount of oxygen exposure during oxidation is 1,000 to 5,000 L (1 L=$1\times10^{-6}$ Torr X sec) for IAO, and 3,000 to 30,000 L for natural oxidation. The oxygen exposure amount for IAO can be calculated on the basis of change in the degree of vacuum in an oxidation chamber which occurs when oxygen gas at a predetermined flow rate is allowed to flow the oxidation chamber without introducing gas such as Ar. For example, if the degree of vacuum is $1\times10^{-4}$ Torr and the oxidation time is 30 sec, it is calculated as ($1\times10^{-4}$ Torr$\times$30 sec)/($1\times10^{-6}$ Torr$\times$sec)=3,000 L. An actual IAO process uses Ar gas for an ion beam or Ar gas for an electron emitter. Although the change in the degree of vacuum in this case is different from that indicated on a vacuum gauge when only oxygen gas is allowed to flow, the oxygen exposure amount under a certain oxygen partial pressure can be calculated as described above.

The IAO process is expected to produce the effect described below. For example, during the PIT process, the first metal may insufficiently intrude into the second metal layer, resulting in inappropriate formation of the current paths. In addition, when AlCu is used as a second metal layer, the PIT process may incompletely separate the second metal layer into Al and Cu. Even if such a phenomenon is caused, IAO can compensate for an insufficiently separated state between Al and Cu during the PIT process. In addition, with the IAO process, irradiation with a rare-gas ion beam, i.e., Ar ion beam, in an oxygen atmosphere enables reduction to occur together with oxidation. That is, Al, which is easily oxidized, is oxidized by the energy assistance effect of the Ar ion beam. However, Cu, which is more difficult to oxidize than Al, is hindered from being oxidized and is reduced by the energy assistance effect of the Ar ion beam. This facilitates the migration of oxygen to Al, i.e., oxidation of Al, which is readily oxidized. As a result, highly pure Cu current paths can be generated. As described later, the improvement of purity of the current paths is important in achieving a high MR ratio based on a physical principle of CCP element. Accordingly, a high MR ratio can be realized by suppressing the oxidation of the current paths.

Figure 3:
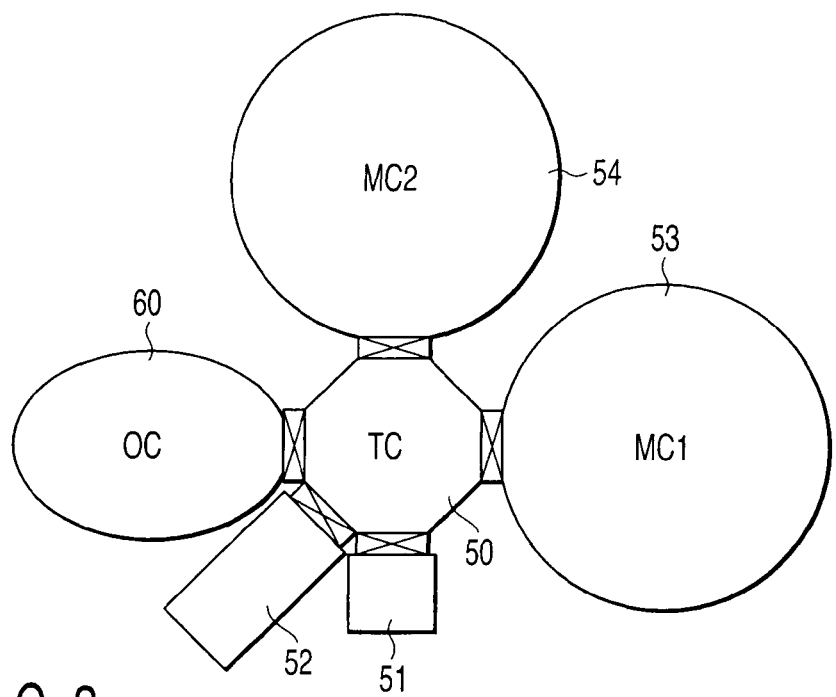
FIG. 3 is a diagram schematically showing the configuration of an apparatus used to manufacture the CCP-CPP element according to the embodiment of the present embodiment.

FIG. 3 schematically shows the configuration of an apparatus used to manufacture the magnetoresistive element (CCP-CPP element) according to the embodiment of the present invention. As shown in FIG. 3, the following are provided around a transfer chamber (TC) via vacuum valves: a load lock chamber 51, a pre-cleaning chamber 52, a first metal deposition chamber (MC1) 53, a second metal deposition chamber (MC2) 54, and an oxidation chamber (OC) 60. In this apparatus, a substrate can be transferred in vacuum between the chambers, connected together via the vacuum valve. This enables the surface of the substrate to be kept clean.

The method described below is used to manufacture the CCP-CPP element according to the embodiment of the present invention using the apparatus shown in FIG. 3. A substrate is loaded into the load lock chamber 51 and then transferred via the transfer chamber 50 through the pre-cleaning chamber 52 to the first metal deposition chamber 53 or second metal deposition chamber 54 in a predetermined order. In these metal deposition chambers, the underlayer 12, the pinning layer 13, the pinned layer 14, a first metal layer forming the current paths in the spacer layer 16, and further a second metal layer to be converted into the insulating layer in the spacer layer 16 are deposited on the substrate having the lower electrode 11. Then, the substrate is transferred to the oxidation chamber 60, where a pretreatment (PIT) and an oxidation treatment (IAO) are performed to form a spacer layer 16 as described above. Since the PIT process does not use any oxygen gas, it can be performed in a metal deposition chamber. After the oxidation treatment, the substrate is transferred via the transfer chamber 50 to the first metal deposition chamber 53 or second deposition chamber 54 in a predetermined order. Thus, the metal layer 17, the free layer 18, the cap layer 19, and an upper electrode 20 are deposited above the spacer layer 16.

Figure 4:
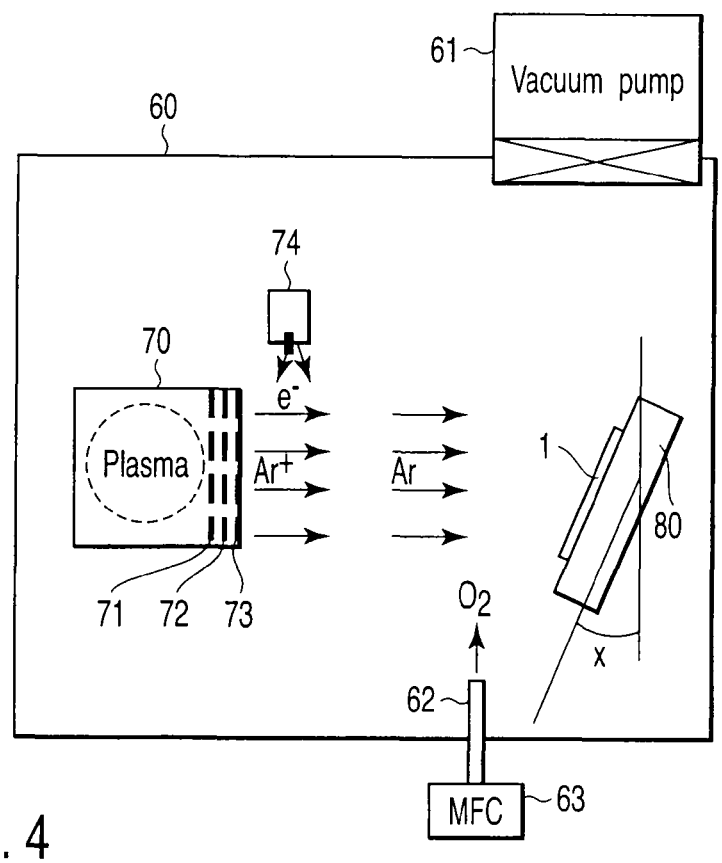
FIG. 4 is a schematic diagram showing an example of the oxidation chamber in FIG. 3.

FIG. 4 schematically shows an example of the oxidation chamber 60 in FIG. 3. As shown in FIG. 4, the oxidation chamber 60 is evacuated by a vacuum pump 61. Oxygen gas is introduced into the oxidation chamber 60 through an oxygen conduit 62; the flow rate of the oxygen gas is controlled by a mass flow controller (MFC) 63. An ion source 70 is provided in the oxidation chamber 60. Types of the ion source include an inductive coupled plasma (ICP) type, a capacitive coupled plasma type, an electron-cyclotron resonance (ECR) type, and a Kauffman type. For the process according to the present invention, the ICP type is desirable, among the above ion source types, because plasma can desirably be generated in an area with low plasma energy (low plasma potential). The ICP type may be modified by, for example, placing a permanent magnet around the ion source in order to enable plasma to be generated with a low RF power. A substrate holder 80 and a substrate 1 are arranged opposite the ion source 70. Three grids 71, 72, and 73 are provided at an ion emission port of the ion source 70 to adjust ion acceleration. A neutralizer 74 is provided outside the ion source 70 to neutralize ions.

The substrate holder 80 is supported so as to be freely tilted. The angle at which ions are incident on the substrate 1 can be varied over a wide range. A typical incident angle ranges between 15 and 60°.

In the oxidation chamber 60, the PIT process can be performed by irradiating the substrate 1 with an ion beam such as Ar, and the IAO process can be performed by irradiating the substrate 1 with an ion beam such as Ar while supplying the chamber 60 with oxygen from the oxygen conduit 62.

As described above, with the method according to the present invention, it is important to stably generate plasma with a low power in order to perform the PIT and IAO processes under moderate conditions. Thus, the usage and structure of the ion source will be described in detail with reference to FIG. 5.

Figure 5:
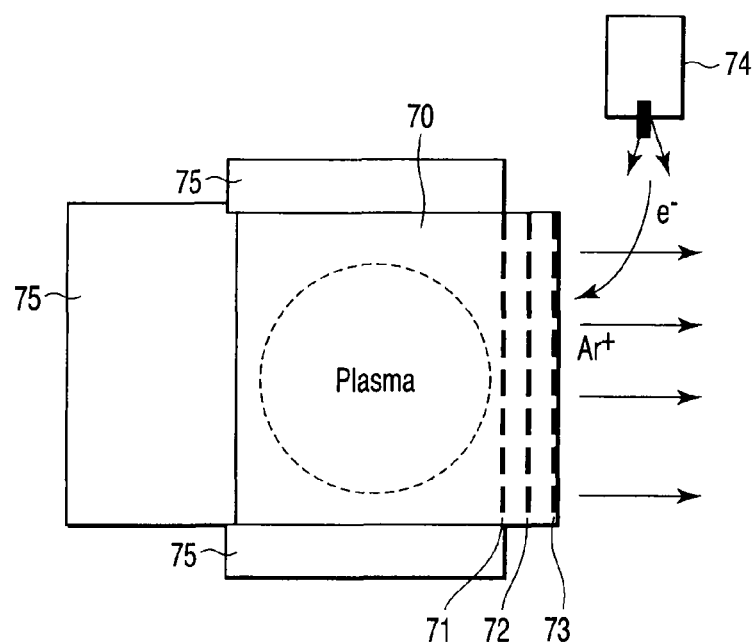
FIG. 5 is a schematic diagram of an example of the ion source in FIG. 4.

FIG. 5 is a diagram showing the ion source 70 in FIG. 4 in detail. An Ar gas, for example, is introduced into the ion source 70. A plasma excitation source 75 is used to generate plasma in the ion source 70. Three grids, a positive (V+) grid, a negative (V−) grid 72, and a ground (GND) grid 73 are arranged at the front surface (ion emission port) of the ion source 70. Such three grids are preferably used to facilitate focusing in order to improve distribution in the film surface. In this case, the negative grid is used for focusing. Such three grids can control the ion beam acceleration voltage within a range between 30 and 200 V. The neutralizer 74 is provided outside the ion source 70 to neutralize ions.

The configuration of the ion source shown in FIG. 5 is similar to that in an ion beam etching apparatus. However, according to the method of the present invention, the ion source is operated under conditions totally different from those used for the ion beam etching apparatus, so as to carry out energy assisted oxidation under moderate, weak conditions. When the ion source is used as an etching apparatus, a high acceleration voltage of 200 to 500 V is applied to the positive grid 71 to cause a reliable etching phenomenon. This hinders, for example, the re-deposition of an etched material. In contrast, with the PIT and IAO processes according to the present invention, the ion beam is not used to cause an etching phenomenon but for the following purposes. With PIT, the ion beam is used for an energy assistance effect for carrying out irradiation with energy to exert sucking action of the current path material from the underlayer. With IAO, the ion beam is used for an energy assistance effect for oxidizing the material (Al or the like) forming an insulating layer that is easily oxidized, while carrying out a reduction reaction to form current paths (Cu or the like) that are not easily oxidized. In either case, the ion beam is not used for the etching phenomenon but for the energy assistance effect. Thus, the PIT and IAO processes according to the present invention normally use an acceleration voltage of about 30 to 130 V or at most 200 V for the positive grid. Moreover, the actual preferable voltage range is between 40 and 60 V. Such a voltage range is never used when the ion source is used as an etching apparatus. Moreover, the range of current values representing the quantity of ion applied by the ion source is totally different from that in the case of an etching apparatus. The etching apparatus uses a current value of about 200 to 300 mA, while the PIT and IAO processes according to the present invention use a low current value of 30 to 200 mA. Moreover, the actual preferable current value range is between 30 and 100 mA. The ion current, as used herein, is defined by a current $I_+$ flowing through the positive grid if the ion beam is used. However, a beam current I actually applied by the ion source is calculated to be the difference between the absolute value of the current $I_+$ flowing through the positive grid, and the absolute value of a current $I_-$ flowing through the negative grid, that is, $I=(I_+)-$ ($I_-$). The current flowing through the negative grid is normally set to as low value as possible such as several mA.

The modifications described below may be made in order to stably generate plasma in such a low current range. For example, in the normal usage of an ion beam apparatus, the potential at the negative (V−) grid 72 is set to a negative value so as to hinder electrons generated by the neutralizer 74 from flowing into the plasma in the ion source 70. In a modification, however, the potential at the negative ($V_-$) grid 72 is set to a low potential value, that is, 0 or 10 V so that the neutralizer 74 can be used not only to neutralize ions but also as an electron emission source for allowing electrons to flow into the plasma in the ion source 70. Such a V− value enables electrons to flow into the ion source, which can then stably generate plasma even at a low current. In this case, the current $I_+$, which flows through the positive grid, is actually the sum of a plasma current $I_{+intrinsic}$ from the ion source and a current $I_{neut}$ resulting from electrons flowing from the neutralizer into the positive grid. That is, when the negative grid is set for a negative voltage with an absolute value of at least 10 V or more, $I_+=I_{+intrinsic}$. In contrast, when the voltage at the negative grid is not set to a minus value, $I_{+intrinsic}=I_+-I_{neut}$. Consequently, the plasma current calculated by $(I_{+intrinsic})-(I_-)$ is the current actually applied to the surface of a sample. This is equivalent to decrease in the effective current. That is, the current actually applied to the sample can be significantly reduced below the apparent current $I_+$, which flows through the positive grid in the apparatus. This technique may be improved so that in addition to an electron source 74 provided outside the ion source as shown in FIG. 5, another electron source may be provided inside the ion source 70. The use of such a method as required enables the substrate to be irradiated with a stable ion beam with a low power and a low current during the PIT and IAT processes.

The means described below may be used to irradiate the substrate with a stable ion beam with a low power and a low current. For example, the ion source may be provided with a permanent magnet or an electromagnet. The ion source may be an RF plasma source with a frequency of 13.56 MHz. The length of an oxygen conduit connecting the mass flow controller 63 for controlling the oxygen flow rate and the oxidation chamber 60 is preferably within a range between 0 and 50 cm. A variable voltage mechanism may be provided which can maintain a fixed voltage of 10 to 50 V during application of an ion beam. If the effect of allowing $I_{neut}$ to flow into the ion source is used to stably generate plasma in a low current region, the mechanism can preferably control the voltage of the neutralizer to a fixed value so as to maintain a stable current value.

The above voltages and currents are also applicable to RF plasma. For RF plasma, the voltage is not the acceleration voltage for the grid but the plasma voltage automatically determined in connection with the RF power determined. Further, the above numerical values correspond to preferable ranges when wafer size is assumed to be six inches. However, with a different substrate size, the preferable range of the current value, which indicates the ion amount, corresponds to a value proportional to the area of the wafer. The voltage value indicates the amount of energy and is thus corresponds exactly to the above preferable range regardless of the wafer size.

Further, it is possible to control the depth from the film surface which is affected by the ion beam treatment by varying the angle at which the ion beam is incident on the substrate 1. If the ion beam is perpendicular to the film surface upon incidence, the effect of the ion beam treatment covers a relatively large depth from the film surface. If the ion beam is inclined at a small angle to the film surface, the effect of the ion beam can be exerted only on the front side. However, the depth affected by the ion beam treatment also varies depending on the time for the ion beam treatment. In the thickness direction, the ion beam treatment can exert an equivalent effect with a short-time process with a perpendicular incidence and with a long-time process with a small-angle incidence. These treatment methods can be used depending on whether or not to enhance an effect of two-dimensional migration of atoms in the film surface.

In FIG. 4, an oxygen gas is introduced into the oxidation chamber 60. However, the oxygen gas may be introduced into the ion source 70 so as to carry out irradiation with an ion beam of the oxygen gas. In this case, since oxygen is applied as an ion beam, oxidation is activated more appropriately than when a simple oxygen gas flow is used. Thus, the oxidation ion beam conditions must further be weakened. Specifically, the conditions may be adjusted by reducing the acceleration voltage by about 10 V, the treatment time by 10 seconds or more, or the incident angle by 10° or more.

In the above description, the PIT and IAO processed are performed in the oxidation chamber 60 using an ion beam. However, the PIT and IAO processes may be performed in an RF plasma chamber in which RF plasma, which enables a similar treatment, can be generated. In this case, the PIT process may be performed in the metal deposition chamber. However, the IAO process is performed in an RF plasma chamber other than the metal deposition chamber. Taking the continuity of the processes into consideration, it is preferable that both the PIT and IAO processes be sequentially performed in an RF plasma chamber other than the metal deposition chamber. This is desirable also in order to keep the metal deposition chamber clean. The preferable PIT/IAO conditions for the RF plasma are similar to that for the ion beam. That is, for the PIT process, preferably the acceleration voltage is about 30 to 130 V, the plasma current, which replaces the beam current, is about 30 to 200 mA, and the RF power is about 10 to 300 W. For the IAO process, preferably the acceleration voltage is about 30 to 200 V, the beam current is 30 to 200 mA, and the RF power is about 10 to 300 W. However, with the RF plasma, setting the value of the RF power determines both acceleration voltage and plasma current. This prevents these parameters from being independently controlled. Consequently, the controllability for the PIT and IAO processes is inferior to that achieved when the ion beam is used. Further, also for the acceleration voltage, the use of the ion beam enables acceleration to be achieved with a particular voltage value. However, with the RF plasma, the voltage range exhibits distribution varying over 10 V, resulting in degraded controllability. From this point of view, the ion beam is more preferably used than the RF plasma. In some cases, however, an RF plasma chamber may be more preferable than an ion beam chamber in view of maintenance of equipment. Therefore, the ion beam or the RF plasma is selectively used according to need.

EXAMPLES

Examples of the present invention will be described below with reference to the drawings. In the examples below, % representing the compositions of alloys means atomic %.

Example 1

Figure 6:
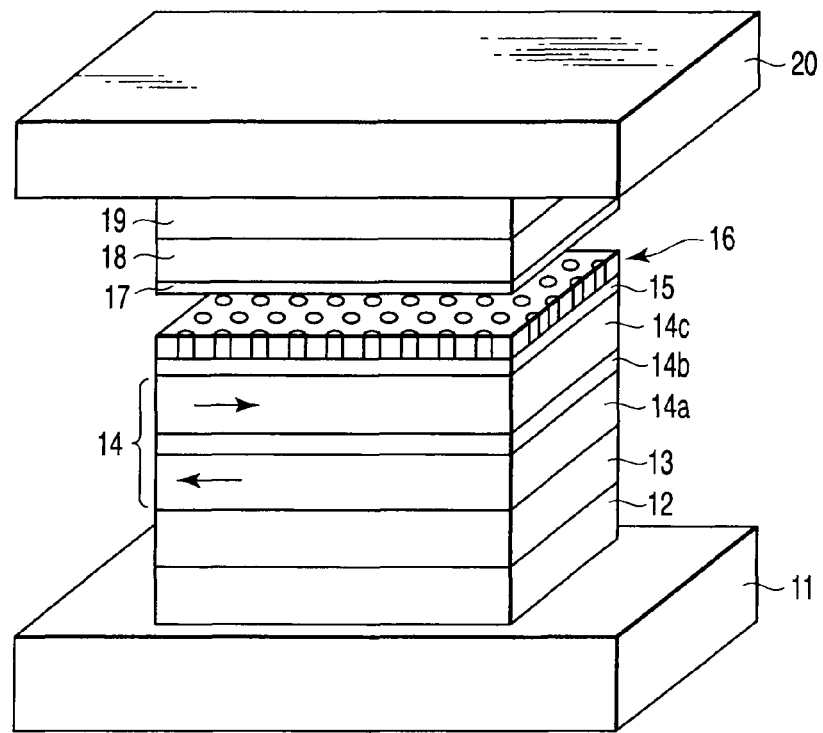
FIG. 6 is a perspective view of a CCP-CPP element according to Example 1.

FIG. 6 is a perspective view of a magnetoresistive element (CCP-CPP element) manufactured in the present example.

The magnetoresistive element shown in FIG. 6 has a structure in which the films listed below are sequentially stacked on a substrate (not shown):

lower electrode 11,
underlayer 12: Ta [5 nm]/Ru [2 nm],
pinning layer 13: $Pt_{50}Mn_{50}$ [15 nm],
pinned layer 14: $Co_{90}Fe_{10}$ [3.6 nm]/Ru [0.9 nm]/($Fe_{50}Co_{50}$ [1 nm]/Cu [0.25 nm])×2/$Fe_{50}Co_{50}$ [1 nm],
metal layer 15: Cu [0.5 nm],
spacer layer (CCP-NOL) 16: $Al_2O_3$ insulating layer 22 and Cu current paths 21 (prepared by depositing $Al_{90}Cu_{10}$ [1 nm], followed by performing PIT and IAO treatment),
metal layer 17: Cu [0.25 nm],
free layer 18: $Co_{90}Fe_{10}$ [1 nm]/$Ni_{83}Fe_{17}$ [3.5 nm],
cap layer 19: Cu [1 nm]/Ru [10 nm], and
upper electrode 20.

In the description below, the spacer 16 and the metal layers 15 and 17, disposed over and under the spacer layer 16, may be collectively called a spacer layer. The CCP-CPP element shown in FIG. 6 is of a bottom type in which the pinned layer 14 is placed in the lower part. However, of course, the CCP-CPP element may be of a top type in which the pinned layer 14 is placed in the upper part. A method for manufacturing the CCP-CPP element shown in FIG. 6 will be described in detail.

A lower electrode 11 is formed on the substrate (not shown); the lower electrode is used to supply a current perpendicularly to the spin valve film. Ta [5 nm] and Ru [2 nm] are deposited on the lower electrode 11 as an underlayer 12. Ta is a buffer layer that, for example, suppresses roughness of the lower electrode. Ru is a seed layer to control the crystal orientation and the grain size of the spin valve film to be deposited thereon.

The buffer layer may be made of Ta, Ti, W, Zr, Hf, Cr, or an alloy thereof. The thickness of the buffer layer is preferably about 2 to 10 nm, and more preferably 3 to 5 nm. The excessively small thickness of the buffer layer eliminates the buffer effect. The excessively large thickness of the buffer layer is not preferable because it increases series resistance, which does not contribute to the MR ratio. However, if the seed layer, deposited on the buffer layer, produces a buffer effect, the buffer layer consisting of Ta or the like need not necessarily be provided.

The seed layer has only to be made of a material that can control the crystal orientation of a layer formed thereon. The seed layer is preferably a metal layer of an hcp or fcc structure. The use of Ru as a seed layer makes it possible to set the crystal of the spin-valve film thereon to fcc (111) orientation and to appropriately keep the crystal orientation of PtMn to an ordered fct structure, and the crystal orientation of bcc metal to bcc (100) orientation. Further, the seed layer enables the crystal grain size of the spin-valve film to be controlled to 10 to 40 nm and makes it possible to achieve a high MR ratio without varying characteristics even when the size of the CCP-CPP element is reduced. A good crystal orientation can be realized; measurements based on X-ray diffraction indicate that rocking curves of the fcc (111) peak of the spin-valve film, the fct (111) peak of PtMn and the bcc (110) peak have a full width at half maximum of 3.5 to 6°. The dispersion angle of the orientation can also be determined from diffraction spots with a cross-sectional TEM.

The seed layer may be formed of, for example, $Ni_xFe_{100-x}$ (x=90 to 50% and preferably 55 to 85%) or $(Ni_xFe_{100-x})_{100-y}X_y$ (X=Cr, V, Nb, Hf, Zr, Mo) which is made nonmagnetic by adding a third element to NiFe instead of Ru. In the case where a NiFe-based seed layer is used, the crystal orientation is improved such that rocking curves measured as described above have a full width at half maximum of 3 to 5°. To obtain an appropriate crystal grain size of 10 to 40 nm, described above, the composition y of the third element X is preferably in a range of about 0 to 30%. To increase the crystal grains above 40 nm, a much larger amount of additive element can be used. For example, in the case of NiFeCr, it is preferable to add about 35 to 45% of Cr and to use a composition exhibiting the boundary phase between fcc and bcc. However, if the element is used as a read head adapted for high density recording, the element size will be 100 nm or less. Accordingly, an excessively large crystal grain size may bring dispersion in characteristics. Thus, it is not so preferable to use such an underlayer material that possibly forms grains larger than 40 nm. On the other hand, if the element is used as, for example, MRAM, even an element with a size of 100 nm or more can be practically used in some applications. Accordingly, it is possible to use a seed layer that increases the grain size in some cases.

The thickness of the seed layer is preferably about 1.5 to 6 nm, and more preferably 2 to 4 nm. The excessively small thickness of the seed layer eliminates effects such as crystal orientation control. The excessively large thickness of the seed layer increases a series resistance and may make the inter-face with the spin-valve film irregular.

A pinning layer 13 is deposited on the underlayer 12. The pinning layer 13 has a function for imparting unidirectional anisotropy to a ferromagnetic layer constituting the pinned layer 14 deposited thereon to pin the magnetization of the pinned layer 14. Materials for the pinning layer 13 include antiferromagnetic materials such as PtMn, PdPTMn, IrMn, and RuRhMn. The thickness of the pinning layer 13 is appropriately set in order to apply unidirectional anisotropy of a sufficient intensity. For PtMn or PdPtMn, the thickness is preferably about 8 to 20 nm, and more preferably 10 to 15 nm. IrMn or RuRhMn can impart unidirectional anisotropy even with a thickness smaller than that of PtMn or the like. Accordingly, for IrMn or RuRhMn, the thickness is preferably 5 to 18 nm, and more preferably 7 to 15 nm. Since IrMn can impart one-directional anisotropy even if the thickness thereof is smaller than that of PtMn, IrMn is suitable to address the narrow gap requirement for high-density recording. Therefore, IrMn is advantageously used for a head adapted to high-density recording. A hard magnetic layer may be used in place of these antiferromagnetic layers. Hard magnetic layers include, for example, CoPt (Co=50 to 85%), $(Co_xPt_{100-x})_{100-y}Cr_y$ (x=50 to 85%, y=0 to 40%), FePt (Pt 40 to 60%). Because of its low specific resistance, the hard magnetic layer, in particular CoPt, serves to suppress adverse effects such as increases in series resistance and RA.

A pinned layer 14 is formed on the pinning layer 13. The pinned layer 14 in the present Example is a synthetic pinned layer of a lower pinned layer 14a ($Co_{90}Fe_{10}$), an Ru layer 14b, and an upper pinned layer 14c ($Fe_{50}Co_{50}$ [1 nm]/Cu [2.5 nm]×2/$Fe_{50}Co_{50}$ [1 nm]). The pinning layer (PtMn) 13 and the lower pinned layer 14a, located immediately above the pinning layer 13, are exchange-coupled so as to have unidirectional anisotropy. The lower pinned layer 14a and upper pinned layer 14c, arranged under and over the Ru layer 14b, respectively, are strongly magnetically coupled so as to have antiparallel magnetization directions.

The lower pinned layer 14a is preferably designed to have a magnetic thickness, that is, saturation magnetization Bs×thickness t (Bs*t product), almost equal to that of the upper pinned layer 14c. In the present Example, the upper pinned layer 14c is ($Fe_{50}Co_{50}$ [1 nm]/Cu [2.5 nm])×2/$Fe_{50}Co_{50}$ [1 nm] and FeCo has a saturation magnetization of about 2.2 T. Consequently, the magnetic thickness is 2.2 T×3 nm=6.6 Tnm. For the lower pinned layer 14a, since $Co_{90}Fe_{10}$ has a saturation magnetization of about 1.8 T, the thickness t of the lower pinned layer 14a required to provide a magnetic thickness equal to that described above is 6.6 Tnm/1.8 T=3.66 nm. The present Example uses $Co_{90}Fe_{10}$ of thickness 3.6 nm. In connection with the unidirectional anisotropic field intensity of the pinning layer (PtMn) and the antiferromagnetic coupling field intensity between lower pinned layer and upper pinned layer, located under and over Ru, respectively, the magnetic layer used as a lower pinned layer preferably has a thickness of about 2 to 5 nm. In view of the coupling field, when the lower pinned layer has an excessively small thickness, the upper pinned layer will also be used in a small thickness. Since the upper pinned layer greatly contributes to the MR effect, to make the upper pinned layer thin implies that the MR ratio is reduced. As a consequence, to use a lower pinned layer with an excessively small thickness brings about reduction of the MR ratio. Inversely, an excessively large thickness compared to the above range makes it difficult to obtain a sufficient unidirectional anisotropic field required for device operation.

The lower pinned layer 14a may be made of, for example, a $Co_xFe_{100-x}$ alloy (x=0 to 100%), a $Ni_xFe_{100-x}$ alloy (x=0 to 100%), or either of these alloys with a nonmagnetic additive element. The lower pinned layer 14a may be made of an elementary substance of Co, Fe or Ni, or an alloy thereof.

The Ru layer 14b has a function for producing antiferromagnetic coupling between the magnetic layers located over and under the Ru layer 14b to form a synthetic pinned structure. The Ru layer 14b preferably has a thickness of 0.8 to 1 nm. A material other than Ru may be used provided that it produces sufficient antiferromagnetic coupling between the magnetic layers located over and under thereof.

The upper pinned layer 14c ($Fe_{50}Co_{50}$ [1 nm]/Cu [2.5 nm]×2/$Fe_{50}Co_{50}$ [1 nm]) constitutes a part of a spin-dependent scattering unit. That is, the upper pinned layer 14c is a magnetic layer that directly contributes to the MR effect. Therefore, both the film materials and the design in thicknesses of the upper pinned layer 14c are very important in order to obtain a large MR ratio. In particular, the magnetic material located at the interface with the spacer layer is important in terms of contribution to spin-dependent interface scattering. The present Example uses $Fe_{50}Co_{50}$ with a bcc structure.

If a magnetic material having the bcc structure is used for the interface with the spacer layer, its high spin-dependent interface scattering effect enables a high MR ratio to be achieved. FeCo-based alloys having the bcc structure include $Fe_xCo_{100-x}$ (x=30 to 100%) and $Fe_xCo_{100-x}$ to which an additive element is added. The metal material used for the spin-valve film often has the fcc or fct structure, so that only the upper pinned layer may have the bcc structure. Thus, the excessively small thickness of the upper pinned structure is not preferable because it prevents the bcc structure from being kept stable, which precludes a high MR ratio from being achieved. The magnetic material functions as an upper pinned layer (pinned layer between the spacer layer and the Ru layer) preferably has a thickness of 2 nm or more; the thickness is preferably 5 nm or less in order to obtain a large pinning field. Further, if the pinned layer is formed of a magnetic layer having the bcc structure, which is likely to achieve a high MR ratio, the layer having the bcc structure preferably has a total thickness of 2 nm or more in order to maintain the bcc structure more stable. The range of thickness of the pinned layer having the bcc structure is preferably set between 2.5 and 4 nm in order to maintain compatibility of the pinning field and the stability of the bcc structure. Also, a material having the composition range from $Fe_{75}Co_{25}$ to $Fe_{85}Co_{15}$, which brings about more stable bcc structure, can be used. The upper pinned layer may be made of a CoFe alloy having the fcc structure or a cobalt alloy having the hcp structure, in place of the magnetic material having the bcc structure. It is possible to use any of elementary metals such as Co, Fe, and Ni and alloys containing any one of these metals. The most advantageous upper pinned layer material for gaining a high MR ratio is a FeCo alloy material having the bcc structure. The second and third most advantageous upper pinned layer materials are a cobalt alloy having a cobalt composition of 50% or more and a nickel alloy having a nickel composition of 50% or more.

In the present Example, the upper pinned layer is composed of a magnetic layer (FeCo layer) and a nonmagnetic layer (very thin Cu layer) alternately stacked. The upper pinned layer having such a structure also makes it possible to improve a spin-dependent scattering effect, called a bulk scattering effect. In the CCP-CPP element, current is confined near the spacer to greatly enhance the contribution of the resistance near the interface with the spacer layer. In this case, the interface scattering effect makes greater contribution than the bulk scattering effect. Accordingly, in the CCP-CPP element, selection of the material located at the interface of the spacer layer and the upper pinned layer is significantly important compared to a conventional CPP element. Nevertheless, it is also effective to use a material producing a significant bulk scattering effect in order to obtain a higher MR ratio. The thickness of the thin Cu layer, which enhances the bulk scattering effect, between the magnetic layers is preferably between 0.1 and 1 nm, and more preferably between 0.2 and 0.5 nm. The excessively small thickness of the Cu layer weakens the effect of improving the bulk scattering effect. The excessively large thickness of the Cu layer is not preferable because it may degrade the bulk scattering effect and weakens the magnetic coupling between the magnetic layers located over and under the nonmagnetic CU layer to make the characteristics of the pinned layer insufficient. The nonmagnetic material between the magnetic layers may be Hf, Zr, Ti, or the like, in place of Cu. On the other hand, the thickness per single layer of the magnetic layer such as FeCo, in the case where a thin nonmagnetic layer is inserted therebetween, is preferably between 0.5 and 2 nm and more preferably between 1 and 1.5 nm.

The upper pinned layer may be made of an alloy of FeCo and Cu instead of a stack of a FeCo layer and a Cu layer. Such a FeCoCu alloy is, for example, $(Fe_xCo_{100-x})_{100-y}Cu_y$ (x=about 30 to 100%, y=about 3 to 15%). However, a different compositional range may be used. The element added to FeCo may be Hf, Zr, Ti, or the like in place of Cu. The upper pinned layer may be a single-layer film of Co, Fe, Ni, or an alloy thereof. For example, as the simplest structure, a single layer of $Co_{90}Fe_{10}$ may be used for an upper pinned layer. An additive element may be added to such a material.

As described above with reference to FIG. 2A, a Cu film is deposited on the pinned layer 14 as a first metal layer serving as a source of the current paths 21 in the spacer layer 16. Then, an AlCu layer is deposited as a second metal layer to be converted into the insulating layer 22 in the spacer layer 16. As described above with reference to FIG. 2B, a pretreatment (PIT) for oxidation is performed by irradiating the AlCu layer, the second metal layer, with an ion beam of a rare gas. In this process, Ar ions are applied at an acceleration voltage of 30 to 130 V, a beam current of 20 to 200 mA, and a treatment time of 30 to 180 seconds. In the present Example, within the above acceleration voltage range, particularly a voltage of 40 to 60 V is used. This is because a higher voltage range may lower the MR ratio owing to, for example, the surface roughened by PIT in some cases. Further, the current value used is between 30 and 80 mA, and the irradiation time used is between 60 and 150 seconds. The deposited first metal layer (Cu layer) is present in the form of a two-dimensional film. The PIT process causes Cu of the first metal layer to be sucked up in the AlCu layer by which Cu intrudes into the AlCu layer. The Cu intruding the AlCu layer remains in a metal state as is after the later oxidation process is performed and forms the current paths. Thus, it is important to perform an energy treatment such as the PIT after the deposition of the second metal layer. Then, as described above with reference to FIG. 2C, the AlCu layer, the second metal layer, is subjected to ion beam-assisted oxidation (IAO). In this process, Ar ions are applied at an acceleration voltage of 40 to 200 V, a beam current of 30 to 200 mA, and a treatment time of 15 to 300 seconds, with oxygen supplied. In the present Example, within the above acceleration voltage range, a voltage of 50 to 100 V is particularly used. This is because a higher voltage range may lower the MR ratio owing to, for example, the surface roughened by PIT in some cases. Further, the current value used was between 40 and 100 mA, and the irradiation time used was between 30 and 180 seconds. Since Al is easily oxidized but Cu is not, a spacer 16 is formed which has an insulating layer 22 of $Al_2O_3$ and current paths 21 of Cu. In the present Example, the range of the oxygen exposure amount during the oxidation by IAO is preferably between 2,000 and 4,000 L. It is not preferable to oxidize not only Al but also the lower magnetic layer during IAO. This is because the oxidation may degrade the heat resistance and reliability of the CCP-CPP element. To improve reliability, it is important that the magnetic material located under the CCP spacer layer is not oxidized but is present in a metal state. To achieve this, the amount of oxygen must be controlled within the above range of the oxygen exposure amount. To form a stable oxide by supplied oxygen, oxygen gas is desirably provided only during the irradiation of the substrate surface with an ion beam. Desirably, no oxygen gas is provided while the substrate surface is not irradiated with an ion beam.

The thickness of the Cu layer is adjusted depending on the thickness of the AlCu layer. The greater thickness of the AlCu layer requires an increase in the amount of Cu intruding the AlCu layer during the PIT process. Accordingly, the thickness of the Cu layer must be increased. For example, when AlCu has a thickness of 0.6 to 0.8 nm, the Cu layer has a thickness of about 0.1 to 0.5 nm. When AlCu has a thickness of 0.8 to 1 nm, the Cu layer has a thickness of about 0.3 to 1 nm. The excessively small thickness of the Cu layer prevents a sufficient amount of Cu from being supplied to the AlCu layer during the PIT process. This precludes the Cu current paths from penetrating the AlCu layer to the upper end thereof. In this case, the area resistance RA is too high and the MR ratio has an insufficient value. On the other hand, excessive thickness of the Cu layer allows a sufficient amount of Cu to be supplied to the AlCu layer during the PIT process but finally leaves a thick Cu layer between the pinned layer 14 and the spacer layer 16. To achieve a high MR ratio in the CCP-CPP element, a current confined in the spacer layer 16 must reach the magnetic layer while keeping the confined state. However, it is not preferable that a thick Cu layer remain between the pinned layer 14 and the spacer layer 16. This is because the current confined in the spacer layer 16 is extended before reaching the magnetic layer, thus lowering the MR ratio.

Instead of Cu, Au, Ag, or the like may be used as a material for the first metal layer, which forms current paths. However, Cu is preferable because it is more stable against a heat treatment than Au and Ag. In place of these nonmagnetic materials, a magnetic material may be used for the first metal layer. Magnetic materials include Co, Fe, Ni, and an alloy thereof. If the same magnetic material is used for the pinned layer and for the current paths, the source (first metal layer) of the current paths need not be provided on the pinned layer. That is, by forming, on the pinned layer, a second metal layer to be converted into the insulating layer and then performing the PIT process, it is possible to allow the material for the pinned layer to intrude into the second metal layer to form current paths of the magnetic material.

If $Al_{90}Cu_{10}$ is used as a second metal layer, not only Cu of the first metal layer is sucked up but also Cu in AlCu is separated from Al to form current paths during the PIT process. Furthermore, if ion beam-assisted oxidation is carried out after the PIT process, the oxidation proceeds with the ion beam assistance effect facilitating the separation of Cu from Al. Instead $Al_{90}Cu_{10}$, a single metal of Al not containing Cu, a current path material, may be used for the second metal layer. In this case, Cu, the current path material, is supplied only from the first metal layer, located under the second metal layer. If AlCu is used for the second metal layer, Cu, the current path material, is also supplied from the second metal layer during the PIT process. Thus, advantageously, current paths can be relatively easily formed even if a thick insulating layer is to be formed. If Al is used for the second metal layer, Cu cannot mix easily into $Al_2O_3$ formed by oxidation. Thus, advantageously, $Al_2O_3$ with a high voltage resistance is easily formed. Each of the cases of using Al and using AlCu exhibits a particular advantage. Therefore, the material of the second metal layer may be selected according to conditions.

The thickness of the second metal layer is about 0.6 to 2 nm for AlCu and about 0.5 to 1.7 nm for Al. The thickness of the insulating layer formed by oxidizing the second metal layer is about 0.8 to 3.5 nm. An insulating layer can be easily produced which has a thickness of about 1.3 to 2.5 nm after oxidation; such an insulating layer is also advantageous in current confined effect. Further, the current paths penetrating the insulating layer have a size of about 1 to 10 nm, more preferably 2 to 6 nm. Metal paths with a size larger than 10 nm are not preferable because they bring about dispersion of device characteristics when the device size is reduced. It is preferable that metal paths with a size larger than 6 nm are not present in the device.

AlCu as a second metal layer preferably has a composition represented by $Al_xCu_{100-x}$ (x=100 to 70%). An additive element such as Ti, Hf, Zr, Nb, Mg, Mo, or Si may be added to AlCu. In this case, the composition of the additive element is preferably about 2 to 30%. The addition of such an additive element may facilitate the formation of a CCP structure. Further, when a larger amount of such an additive element is distributed in the boundary area between the $Al_2O_3$ insulating layer and the Cu current paths than in the other areas, adhesion between the insulating layer and the current paths is improved, which brings about an effect of improving electromigration resistance in some cases. In the CCP-CPP element, a very high current density of $10^7$ to $10^{10}$ $A/cm^2$ is achieved in the metal current paths in the spacer layer. Accordingly, it is important to improve the electromigration resistance and to keep the Cu current paths stable during current supply. However, with an appropriate CCP structure formed, a sufficiently high electromigration resistance can be provided without adding any additive element to the second metal layer.

The material for the second metal layer is not limited to the Al alloy, which forms $Al_2O_3$, but may be an ally mainly composed of Hf, Mg, Zr, Ti, Ta, Mo, W, Nb, Si, or the like. Further, the insulating layer into which the second metal layer is converted is not limited to the oxide but may be a nitride or an oxynitride. Whatever material is used for the second metal layer, the second metal layer preferably has a thickness of about 0.5 to 2 nm after deposition and a thickness of about 0.8 to 3.5 nm after conversion into an oxide, a nitride, or an oxynitride.

Cu [0.25 nm] is deposited on the spacer layer 16 as a metal layer 17. The metal layer 17 functions as a barrier layer that prevents the free layer deposited thereon from contacting the oxide in the spacer layer 16. The insulating layer in the spacer layer may be an amorphous layer. In this case, use of Cu exhibiting a stable fcc structure as the metal layer 17 is preferable because this brings about an effect of improving crystallinity deposited thereon. However, since these problems may be avoided by optimization of anneal conditions, selection of an insulating material in the spacer layer, and a material of free layer, the metal layer 17 on the spacer layer 16 need not necessarily be provided. Thus, the metal layer 15, located under the spacer layer 16, is essential because it is a source of current paths. On the other hand, the metal layer 17 on the spacer layer 16 is not essential. However, in view of the purposes to ensure a process margin or stability in characteristics, it is practically preferable to form the metal layer 17 of Cu on the spacer layer 16. Instead of Cu, Au, Ag, Ru, or the like may be used as a material for the metal layer 17. However, the material for the metal layer 17 is preferably the same as that for the current paths in the spacer layer 16. If different materials are used for the metal layer 17 and for the current paths, the interface resistance increases. However, this is prevented if the same material is used for both components. The thickness of the metal layer 17 is preferably between 0 and 1 nm, and more preferably between 0.1 and 0.5 nm. The excessively large thickness of the metal layer 17 extends a current confined by the spacer layer 16 to make the current confined effect insufficient, resulting in lowering of the MR ratio. The effect provided by the use of the metal layer 17 and the disadvantage that the current confined effect becomes insufficient due to excessively thick metal layer 17 are balanced in the above thickness range, which is the reason why the above thickness is preferred.

$Co_{90}Fe_{10}$ [1 nm] and $Ni_{83}Fe_{17}$ [3.5 nm] are deposited on the metal layer 17 as a free layer 18. Selection of the magnetic material for the free layer 18 located at the interface with the spacer layer is important for achieving a high MR ratio. In this case, a CoFe alloy is more preferably provided at the interface with the spacer layer than a NiFe alloy. Of the CoFe alloys, $Co_{90}Fe_{10}$, which has a particularly stable soft-magnetism, is used in the present Example. If a CoFe alloy near $Co_{90}Fe_{10}$ is used, it preferably has a thickness of 0.5 to 4 nm. If a CoFe alloy of a different composition (for example, the composition described in connection with the pinned layer) is used, it preferably has a thickness of 0.5 to 2 nm. If the free layer is composed of, for example, $Fe_{50}Co_{50}$ (or $Fe_xCo_{100-x}$ (x=45 to 85)) similarly to the pinned layer in order to enhance the spin-dependent interface scattering effect, an excessively large thickness must be avoided in order to maintain the soft-magnetism of the free layer. Consequently, the preferable thickness range is between 0.5 and 1 nm. If Fe free from Co is used, the thickness may be between about 0.5 and 4 nm because this metal has a relatively good soft-magnetism. The NiFe layer provided on the CoFe layer is a material having the most stable soft-magnetism. The CoFe alloy does not have a very stable soft magnetism but its soft magnetism can be supplemented by providing the NiFe alloy thereon. Since a material capable of achieving a high MR ration can be used at the interface to the spacer layer, it is preferable to use NiFe as the free layer to improve characteristics of the spin-valve as a whole. The composition of the NiFe alloy is preferably $Ni_xFe_{100-x}$ (x=about 78 to 85%). The present Example uses the composition ($Ni_{83}Fe_{17}$) containing a larger amount of Ni than the composition $Ni_{81}Fe_{19}$ of common NiFe. This is because if a free layer is formed on a spacer layer having the CCP structure, the Ni composition for realizing zero magnetostriction deviates slightly from the common NiFe. Specifically, magnetostriction of the CoFe shifts toward positive when it is deposited on the spacer layer of CPP structure compared to the case that it is deposited on a metal Cu spacer layer. Thus, it is preferable to use NiFe containing more Ni than common NiFe, which makes it possible to shift the magnetostriction toward negative, to cancel the above magnetostriction shift toward positive. The NiFe layer preferably has a thickness of about 2 to 5 nm. If the NiFe layer is not used, a free layer may be used in which a plurality of CoFe or Fe layers with a thickness of about 1 to 2 nm and a plurality of very thin Cu layers with a thickness of about 0.1 to 0.8 nm are alternately stacked.

Cu [1 nm] and Ru [10 nm] are stacked on the free layer 18 as a cap layer 19. The cap layer 19 has a function for protecting the spin-valve film. The Cu layer preferably has a thickness of about 0.5 to 10 nm. An Ru layer may be provided directly on the free layer 18 to a thickness of about 0.5 to 10 nm without providing any Cu layer. When NiFe is used in the free layer on the side of the cap layer, opposite to the spacer side, magnetostriction of an interface mixing layer formed between the free layer and the cap layer can be lowered because of non-soluble relationship between Ru and Ni, which brings about preferred effect. In place of the Cu or Ru layer, another metal layer may be used. The configuration of the cap layer is not particularly limited and any material may be used provided that it can produce a capping effect. It should be noted that, however, the material selected for the cap layer may affect the MR ratio and long-term reliability. Cu and Ru are desirable material for the cap layer in view of these characteristics. An upper electrode 20 is formed on the cap layer 19 to supply a current perpendicularly to the spin-valve film.

The CCP-CPP element of the present Example indicated characteristics of RA=500 m$\Omega\mu m^2$, MR ratio=9%, and $\Delta$RA=45 m$\Omega\mu m^2$. Such a high MR ratio was achieved because the selection of the appropriate PIT and IAO ion beam conditions as described above enabled the improvement of purity of the Cu current paths. Such a CCP-CPP element makes it possible to provide a read head that can be adapted to a recording density of 150 to 300 Gpsi. Further, when the above PIT and IAO ion beam parameters had larger values, RA changed to a smaller value. The following values were obtained: RA=300 m$\Omega\mu m^2$, MR ratio=8.5%, and $\Delta$RA=25.5 m$\Omega\mu m^2$. By setting stronger conditions for the PIT and IAO ion beam parameters, it is possible to increase the density of current paths of the CCP structure in the film two-dimensional surface to reduce the resistance RA.

The larger values for the ion beam parameters mean an increased beam energy value, an increased beam current value, an extended beam irradiation time, and the like.

The bottom type CCP-CPP element has been described in which the pinned layer is located below the free layer. However, the method according to the embodiment of the present invention is similarly applicable to a top type CCP-CPP element. To manufacture a top type CCP-CPP element, the layers provided between the underlayer 12 and the cap layer 19 in FIG. 6 may be deposited in the order opposite to that shown in FIG. 6. The functions of the metal layers (Cu layers) located over and under the spacer layer provide the same functions for both top- and bottom-type CCP-CPP elements.

That is, the Cu layer under the spacer layer is essential because it is a source of current paths. However, the Cu layer over the spacer layer is not essential.

Example 2

Comparison between the characteristics of CCP-CPP elements produced by various methods will be described. The materials for the layers from the underlayer 12 to the cap layer 19 are listed below:

underlayer 12: Ta [5 nm]/Ru [2 nm],
pinning layer 13: $Pt_{50}Mn_{50}$ [15 nm],
pinned layer 14: $Co_{90}Fe_{10}$ [4 nm]/Ru [0.9 nm]/$Co_{90}Fe_{10}$ [4 nm],
metal layer 15: Cu [2.5 nm],
spacer layer (CCP-NOL) 16: $Al_2O_3$ insulating layer and Cu current paths 21 (prepared by depositing $Al_{90}Cu_{10}$ [x nm], followed by performing PIT and IAO treatment),
metal layer 17: Cu [2.5 nm],
free layer 18: $Co_{90}Fe_{10}$ [1 nm]/$Ni_{83}Fe_{17}$ [3.5 nm],
cap layer 19: Cu [1 nm]/Ru [10 nm].

In the present example, the thickness x of AlCu, used as a second metal layer, was varied between 0.5 and 1 nm. To vary the thickness of AlCu corresponds to vary the area ratio of the current paths in the CCP-NOL surface, and thus, this enables to adjust RA of the CCP-CPP element. That is, RA increases consistently with the thickness of AlCu. In the present example, $Co_{90}Fe_{10}$ was used as a magnetic material for both pinned and free layers located adjacent to the spacer layer. In the case where $Co_{90}Fe_{10}$ is used, the MR ratio is reduced compared to the case of $Fe_{50}Co_{50}$/Cu used in Example 1. However, the present example uses the simple structure in order to compare manufacturing methods with one another.

In this Example 2, a method of forming a first and second metal layers and then forming CCP-NOL using the PIT and IAO processes. To compare with the above method, the methods described below were used.

Comparative Example 1

Method of forming a first and second metal layers and then forming CCP-NOL using natural oxidation (NO) without the PIT process.

Comparative Example 2

Method of forming a first and second metal layers and then forming CCP-NOL using the IAO process without the PIT process.

Figure 7:
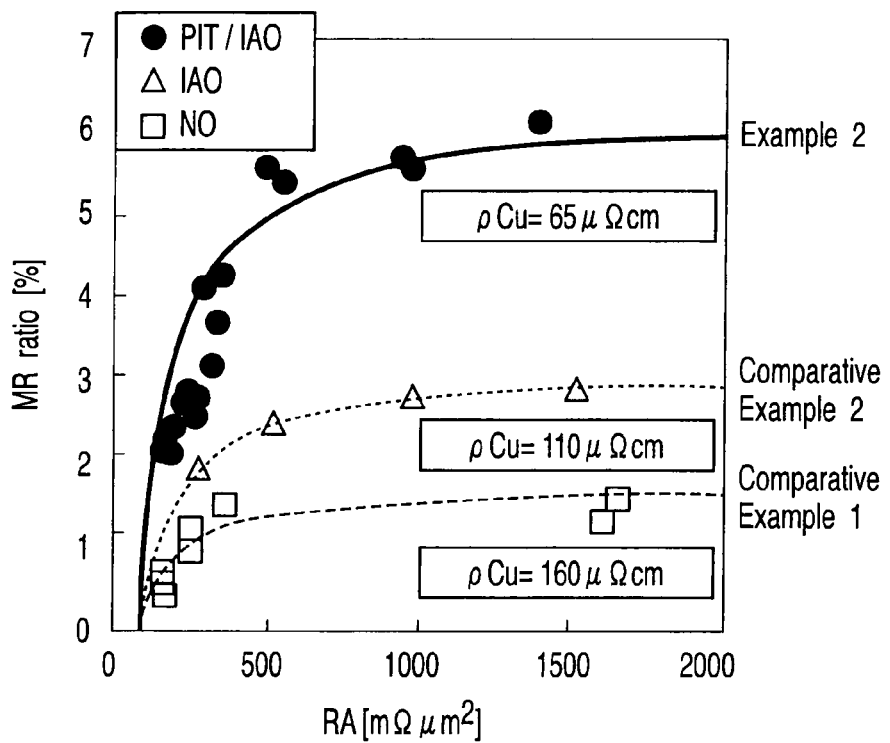
FIG. 7 is a graph showing the relationship between the RA and the MR ratio of a CCP-CPP element manufactured according to Example 2.

FIG. 7 shows the relationship between the RA and MR ratio of CCP-CPP elements manufactured by using the above methods.

For reference, the characteristics of a metal CPP element using Cu [5 nm] as a spacer layer were: RA=100 mΩμm², ΔRA=0.5 mΩμm², and MR ratio=0.5%.

In the case of Comparative Example 1 where CCP-NOL was formed by natural oxidation, the MR ratio increased consistently with RA and 1.5% at RA of 380 mΩμm². Both RA and MR ratio were higher than those for the metal CPP element. This indicates that the presence of CCP-NOL improves the MR ratio.

When a CCP-CPP spin-valve film structure can be implemented, the MR ratio increases consistently with RA until RA reaches a range between 500 and 1,000 mΩμm². However, in principle, a further increase in RA saturates the MR ratio into an almost constant value. Actually, for elements exhibiting RA of 1,000 mΩμm² or more, not only the current paths have a reduced area ratio but also RA may be increased due to oxidation of the lower magnetic layer or other adverse affects. Thus, when RA becomes over 1,000 mΩμm², the MR ratio may decrease.

In the case of Comparative Example 2 where CCP-NOL was formed by the IAO process, the MR ratio was 2.5% at RA of 500 mΩμm². In contrast to Comparative Example 1, the value of the MR ratio could be nearly doubled at the same RA.

In the case of Example 2 where CCP-NOL was formed by the PIT and IAO processes, the MR ratio was 5.5% at RA of 500 mΩμm². That is, the present Example achieved a high MR ratio at least twice as high as that in Comparative Example 2 and at least four times as high as that in Comparative Example 1.

Figure 8:
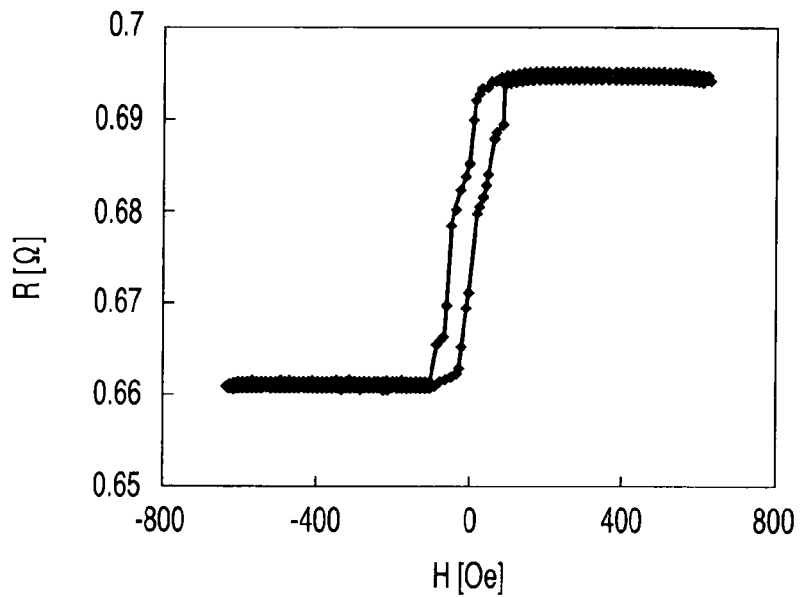
FIG. 8 is a graph showing an R-H loop of the CCP-CPP element according to Example 2.

FIG. 8 shows an R-H loop of the CCP-CPP element produced according to Example 2. The R-H loop was measured at a field intensity of H=600 Oe or less taking practical uses into account. It has been reported that if local pinholes function as current paths are created in a TMR element when a very thin insulating layer is used, the R-H loop thereof is shifted to be asymmetric to the magnetic field due to influence of a local current field (see B. Oliver et al., J. Appl. Phys., 91, 4348 (2002)). However, as shown in FIG. 8, the R-H loop of the CCP-CPP element produced according to the present example is symmetric to the magnetic field. This indicates that the method according to the present invention permits to form a satisfactory CCP-NOL in which a large number of current paths are formed in the insulating layer uniformly.

The principle of improvement of the MR ratio by the formation of CCP-NOL using the method according to the present invention will be discussed below. Here, the discussion will be based on the model proposed by Valet and Fert, referred to as a Valet-Fert model hereinafter (T. Valet and A. Fert, Phys. Rev. B 48, 7099 (1993)). To discuss experiments according to the present example, the Valet-Fert model must be adapted to the CCP-CPP element. The following assumption was made in order to extend the Valet-Fert model. That is, in the CCP-CPP element, a current is confined in the current paths in the spacer layer, so that the area of the interface between the spacer layer and the pinned layer or free layer is dependent on the area ratio D [%] of the current paths. Further, in the CCP-CPP element, the resistance of the spacer layer accounts for a larger percentage of the total resistance. Consequently, of the spin-dependent scattering, the interface scattering effect is more significant than the bulk scattering effect. Thus, the bulk scattering effect is neglected for simplification of calculations herein.

Figures 9A, 9B:
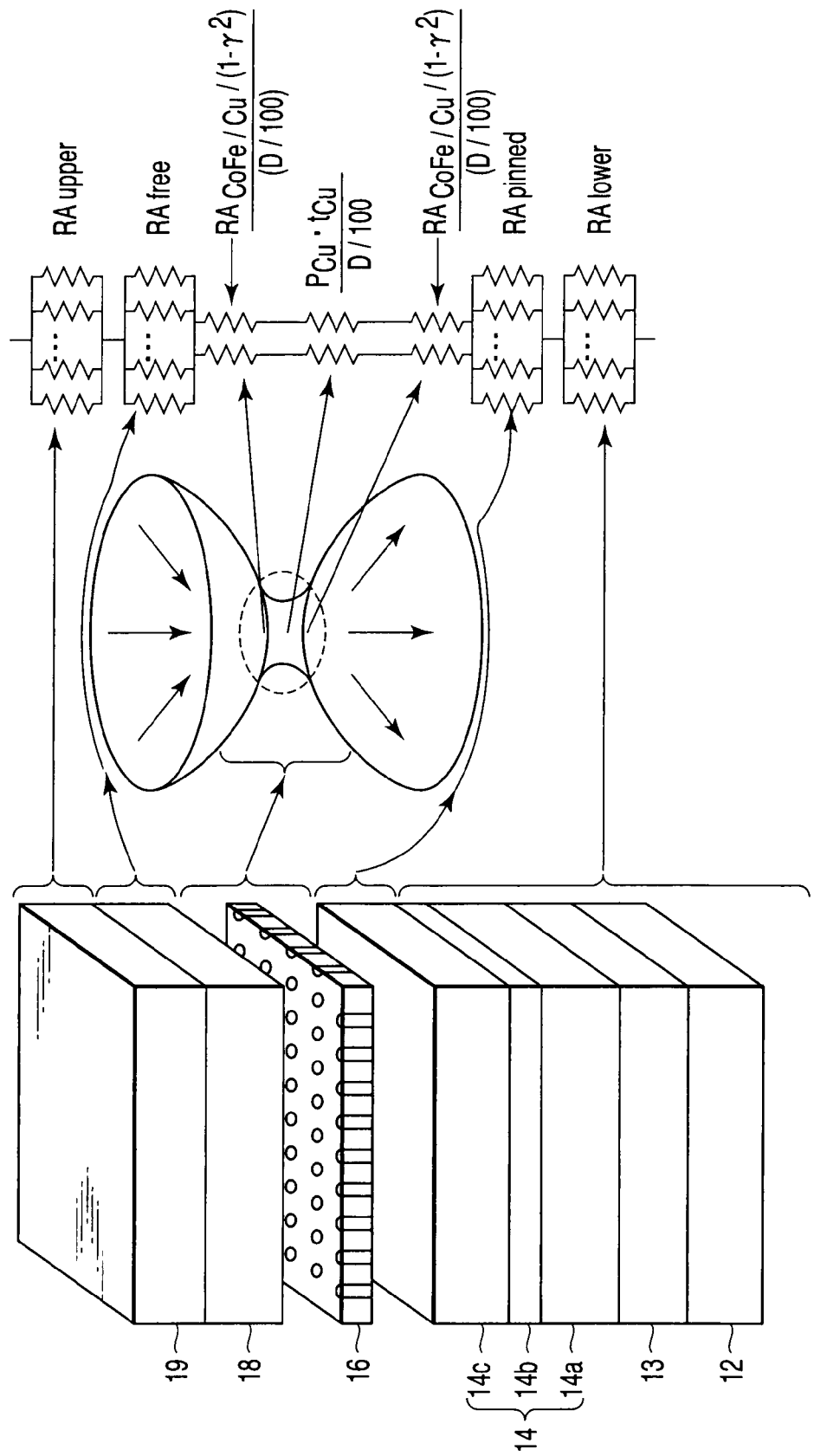

FIG. 9A shows a perspective view of the CCP-CPP element according to Example 2. FIG. 9B shows an enlarged perspective view of a current path. FIG. 9C shows an equivalent circuit diagram of the CCP-CPP element according to the present example.

In FIG. 9C, $RA_{upper}$ denotes the area resistance of the cap layer 19 and upper electrode, located above the free layer 18. $RA_{free}$ denotes the area resistance of the free layer 18. $RA_{pinned}$ denotes the area resistance of the upper pinned layer 14c, sandwiched between Ru and CCP-NOL, which contributes to the GMR effect. $RA_{lower}$ denotes the area resistance of Ru 14b, lower pinned layer 14a, pinning layer 12, underlayer 12, and lower electrode, located above the upper pinned layer 14c. As shown in FIG. 9C, the resistance of the Cu current path in CCP-NOL is determined by diving the product of the specific resistance $\rho_{Cu}$ and thickness $t_{Cu}$ of the Cu current path by the area ratio D of the current path, that is, $\rho_{Cu}t_{Cu}/(D/100)$. The interface resistance between the current path and the free layer 18 or upper pinned layer 14c (in both interfaces, the current path is in contact with CoFe) is determined by dividing $RA_{CoFe/Cu}$ by the area ratio D of the current path taking an interface scattering coefficient γ into account, that is, $RA_{CoFe/Cu}/(1-\gamma^2)/(D/100)$.

In the above model, $RA_{CCP}$ of CCP-NOL is expressed by equation (1), and $\Delta RA_{interface}$ is expressed by equation (2).

$$RA_{CCP} = \frac{\{2RA_{CoFe/Cu}/(1-\gamma^2) + \rho_{Cu} t_{Cu}\}}{(D/100)} \; [m\Omega\mu m^2] \quad (1)$$

$$\Delta RA_{interface} = \frac{(\Delta RA_{pinned/spacer} + \Delta RA_{free/spacer})}{(D/100)} \quad (2)$$
$$= \frac{(4\gamma RA^*_{CoFe/Cu}{}^2/(\rho_{Cu} t_{Cu} + 2RA^*_{CoFe/Cu}))}{(D/100)} \; [m\Omega\mu m^2]$$

On the basis of these models, the relationship between the RA and MR ratio of the CCP-CPP spin-valve film was calculated. First, the RA value except for $RA_{CCP}$ was set to 100 $m\Omega\mu m^2$. This value was introduced from an RA value experimentally determined for a metal CCP element. $RA_{CoFe/Cu}$ was set to 0.2 $m\Omega\mu m^2$ on the basis of document values. The thickness $t_{Cu}$ was set to 1.5 nm, which was equal to the thickness of CCP-NOL obtained from cross-sectional TEM observation. The interface scattering coefficient γ was set to 0.62, which was experimentally determined for a metal CCP element. FIG. 7, already described, shows lines obtained by fitting experimental data on the MR ratio to RA using the above values and using the specific resistance $\rho_{Cu}$ of the Cu current path in CCP-NOL as a parameter.

As shown in FIG. 7, the experimental data appropriately match the fitting lines. This indicates that calculations based on the models for which the CCP-NOL structure is assumed are valid. For Comparative Example 1 (natural oxidation) and Comparative Example 2 (IAO), the fitting lines express the tendency in which the MR ratio increases consistently with RA until RA reaches about 500 $m\Omega\mu m^2$ and in which a further increase in RA almost saturates the MR ratio. Therefore, the improvement of the MR ratio in FIG. 7 can be described as the effect of the CCP-NOL structure.

Further discussion will be made by focusing on the specific resistance $\rho_{Cu}$ of the CU current path, the parameter used for the fitting in FIG. 7. The specific resistance $\rho_{Cu}$ is 160 μΩcm in Comparative Example 1 (natural oxidation), 110 μΩcm in Comparative Example 2 (IAO), and 65 μΩcm in Example 2 (PIT and IAO). The specific resistance $\rho_{Cu}$ of the Cu current path in Comparative Example 2 is lower than that in Comparative Example 1. This indicates that IAO increases the purity of the Cu current path beyond that achieved by natural oxidation. If CPP-NOL is formed by natural oxidation, not only Al but also Cu are oxidized to some degree. In contrast, if IAO is used to form CPP-NOL, Al that is low in energy of oxidation is easily oxidized, but Cu that is high in energy of oxidation is not easily oxidized because of a reducing effect accompanied by Ar ion beam assist.

When CPP-NOL is formed by PIT and IAO (Example 2), the purity of the Cu current path is higher than that achieved when CPP-NOL is formed only by IAO (Comparative Example 2). This is because the PIT process before IAO separates Cu from Al and because the suction phenomenon from the underlying Cu layer causes the formation of Cu paths. That is, the important factors determining the purity of the Cu current paths are (1) the degree of separation of the Cu paths from Al in the metal state prior to oxidation (formation of Cu paths penetrating the Al layer across the thickness) and (2) the oxidation only of Al and the avoidance of oxidation of Cu during oxidation process. PIT can facilitate the separation of Cu from Al before oxidation to realize the effect (1), thus allowing the effect (2) to be easily established. In addition, during the oxidation process, IAO is more preferable than natural oxidation for allowing the effect (2) to be realized particularly easily. Moreover, natural oxidation without energy assistance is not substantially be expected to produce the effect (1) during oxidation. However, energy assisted IAO also enables to facilitate the separation phenomenon in (1) during oxidation (formation of $Al_2O_3$ and separation of metal Cu before oxidation), thus achieving a high MR ratio.

As described above, the PIT and IAO process improves the MR ratio because it reduces the specific resistance of the Cu current paths in the CCP-NOL structure, in other words, the process increases the purity of Cu in the Cu current paths.

The PIT process according to the present invention is based on the suction of Cu from the first metal layer. Typical experiment results regarding this phenomenon will be described below. When an AlCu alloy as a second metal layer is formed without forming a first metal layer (Cu layer) in advance, the PIT and IAO process cannot realize a low RA and accordingly a high MR ratio. That is, if the first metal layer (Cu layer) is not formed, the Cu current paths cannot be formed even with the PIT and IAO process. This indicates that Cu cannot perfectly be separated from Al if the PIT process is applied to the AlCu alloy. On the other had, in the case where the first metal layer (Cu layer) is formed, even if a single metal Al free from Cu is used as a second metal layer, the PIT/IAO process gives a low RA and a high MR ratio. When Al as a second metal layer is formed without forming a first metal layer (Cu layer) in advance, the PIT and IAO process cannot significantly lower RA and gives a low MR ratio. These results indicate that as long as the first metal layer (Cu layer) is formed, current paths are formed even if the second metal layer is made of Al not containing Cu. Therefore, with the PIT and IAO process according to the present invention, the PIT process causes the suction of Cu from the first metal layer, and IAO allows the formation of good current paths penetrating the insulating layer. The suction of Cu from the underlying Cu layer by PIT has been confirmed by XPS surface analysis for a model sample, in which the phenomenon that the PIT process causes the underlying metal to be sucked up so as to penetrate the Al layer is observed. Specifically, XPS surface analysis for the structure of underlayer/Cu [0.25 nm]/Al [0.9 nm]/cap indicates that Cu peaks are weak when PIT is not performed but the PIT process causes significant increase of Cu peaks corresponding to increase in the concentration of Cu in the film surface.

Figure 10A:
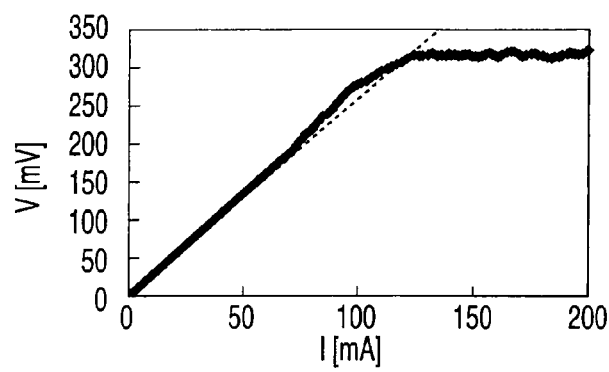
FIGS. 10A and 10B are graphs showing the I-V and R-V characteristics of the CCP-CPP element according to Example 2.
Figure 10B:
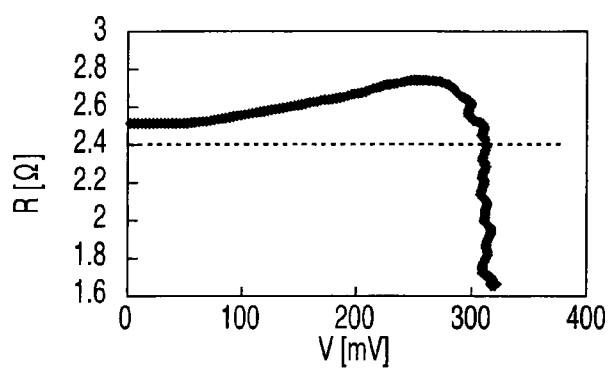

FIGS. 10A and 10B show the I-V and R-V characteristics, respectively, of a CCP-CPP element produced via the PIT/IAO process according to the present example. As shown in FIG. 10A, the CCP-CPP element exhibits a linear and ohmic I-V characteristic. This indicates that metallic electron conduction characteristics are realized because highly pure Cu current paths are formed so as to penetrate the oxide layer in the spacer. In FIG. 10B, the resistance R increases slightly with increasing voltage V because of Joule heat. The abrupt drop of the resistance R near V=310 mV shown in FIG. 10B is due to structural failure of the CCP-NOL.

Figure 11A:
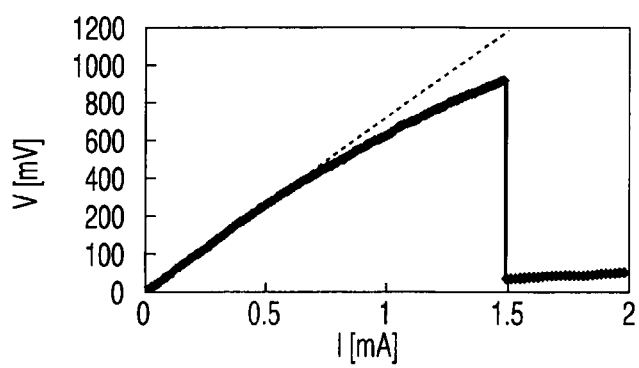
FIGS. 11A and 11B are graphs showing the I-V and R-V characteristics of an element similar to a TMR element produced for comparison with Example 2.
Figure 11B:
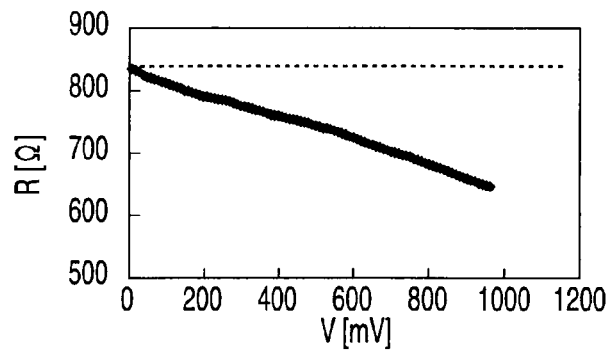

FIGS. 11A and 11B show the I-V and R-V characteristics, respectively, of an element produced by performing the PIT and IAO process to the second metal layer (AlCu) without forming the first metal layer (Cu layer). FIG. 11B shows the tunnel conduction characteristics that resistance decreases with increasing voltage. Also, FIG. 11A shows poor linearity of the I-V characteristics. These results indicate that, if the first metal layer (Cu layer) is not formed, no Cu current paths are formed even with the PIT and IAO process, resulting in an element similar to a TMR (tunneling magnetoresistance) element. The reason why voltage drops abruptly at I=1.5 mA in FIG. 11A is due to dielectric breakdown of the tunnel barrier layer.

In order to form a spacer layer 16 having a good insulating portion and high-purity current paths with a low $\rho_{Cu}$ value, an ion-beam treatment may be further performed after the PIT/IAO treatments. This treatment is referred to as an AIT (after ion treatment) relative to the PIT (pre-ion treatment). The AIT aims at following two effects: (1) When the IAO is performed, CuO is generated by oxidation of Cu in the IAO and remains after the IAO. The particular ion-beam treatment (AIT) can reduce CuO back to Cu, making it possible to improve the purity of the metal paths and to raise the MR ratio. (2) In the spacer layer, $Al_2O_3$ and Cu are not completely separated after the IAO. The particular ion-beam treatment (AIT) can enhance the separation of $Al_2O_3$ and Cu. The beam conditions for the AIT can be similar to those conditions either for the PIT or the IAO. AIT can be performed using RF plasma instead of an ion beam. Further, if the AIT conditions are optimized, it may be possible to provide a high MR ratio by only performing the IAO and AIT processes without performing the PIT process. In this case, it is preferable to perform the oxidation by the IAO not the natural oxidation in order to provide a high MR ratio as the case described above. However, the natural oxidation can be used in some cases. If the AIT is performed under intense beam conditions, the surface of the sample may be roughened, which may increase an interlayer coupling field $H_{in}$ between the pinned layer and the free layer. Therefore, it is necessary to optimize the beam conditions for the AIT.

Example 3

In the present Example, materials advantageous for achieving a high MR ratio in a CCP-CPP element manufactured by the method according to the present invention will be described. Specifically, $Co_{90}Fe_{10}$ or $Fe_{50}Co_{50}$ was used as a material for the magnetic layers provided over and under the spacer layer. The layers in the CCP-CPP element from the underlayer to the cap layer are as follows:

underlayer: Ta [5 nm]/Ru [2 nm],
pinning layer: PtMn [15 nm],
pinned layer: $Co_{90}Fe_{10}$ [4 nm]/Ru [0.9 nm]/"Mag" [4 nm],
metal layer: Cu [2.5 nm],
spacer layer: $Al_2O_3$ insulating layer and Cu current paths 21 (prepared by depositing $Al_{90}Cu_{10}$ [x nm], followed by performing PIT and IAO treatment),
metal layer: Cu [2.5 nm], and
free layer: "Mag" [4 nm].

Figure 12:
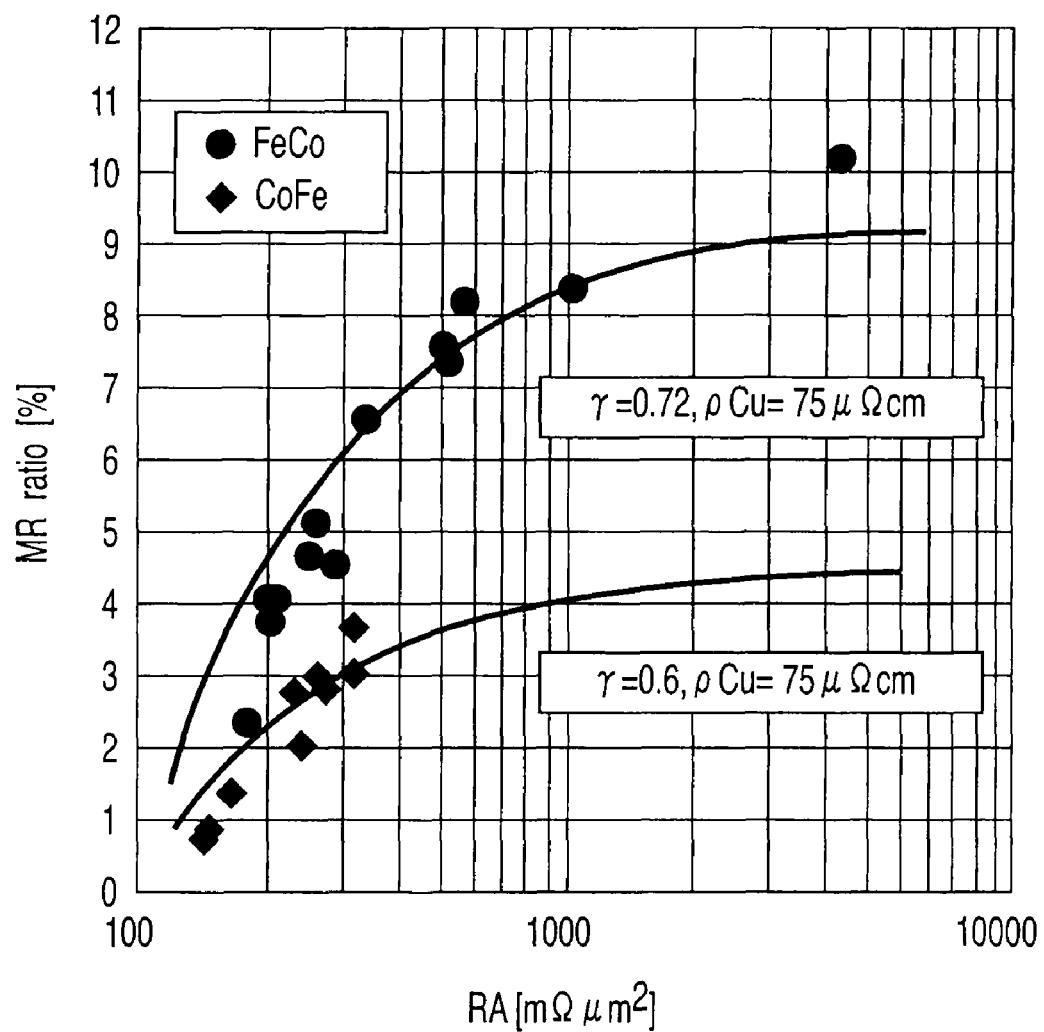
FIG. 12 is a graph showing the relationship between the RA and the MR ratio of a CCP-CPP element according to Example 3.

In the present example, $Co_{90}Fe_{10}$ or $Fe_{50}Co_{50}$ was used as a magnetic layer denoted as "Mag". FIG. 12 shows evaluations of the characteristics of these CCP-CPP elements. FIG. 12 also shows the results of fitting based on the Valet-Fert model described in Example 2.

As is apparent from FIG. 12, the use of $Fe_{50}Co_{50}$ as the magnetic layers increases the MR ratio compared to the use of $Co_{90}Fe_{10}$. In FIG. 12, measured data agrees well with the results of the fitting based on the Valet-Fert model. The improvement of the MR ratio can be interpreted by the fact that the interface scattering rate γ of FeCo, 0.72, is larger than that of CoFe, 0.62. The γ values were derived from experiments for metal CCP elements including a spacer layer made of Cu [5 nm] (see H. Yuasa et al, J. Appl. Phys., 92, 2646 (2003)). Therefore, in order to achieve a high MR ratio in the CCP-CPP element, it is particularly important to use a magnetic material with a high interface scattering rate γ. More specifically, in a case of the CCP-CPP element having the CCP structure, the interface resistance between the spacer layer and the magnetic layer greatly contributes the total element resistance, so that the influence of the interface scattering rate γ to the MR ratio becomes remarkably large compared to the case of the CPP element without the CCP structure. A preferable magnetic material with a high interface scattering rate γ is, for example, $Fe_{50}Co_{50}$, which has a composition expressed by $Fe_xCo_{100-x}$ (x=30 to 100%) of a bcc structure.

In the present example, the $\rho_{Cu}$ values (75 μΩcm) are equivalent regardless of the type of the magnetic materials. Accordingly, there is substantially no difference in the purity of the current paths between two elements. This is because the present example uses the same PIT and IAO conditions regardless of which of the magnetic materials is used for the element. On the other hand, $\rho_{Cu}$ in the present example, 75 μΩcm, is larger than that in Example 2, 65 μΩcm, indicating slightly poor purity of the current paths. This is due to difference in PIT and IAO conditions between the present example and Example 2.

(Application)

Application of the magnetoresistive element (CCP-CPP element) according to the embodiments of the present invention will be described below.

In the embodiments of the present invention, the RA of the CPP element is preferably set to 500 mΩμm² or less, more preferably 300 mΩμm² or less, in view of achieving higher density. The element resistance RA is calculated by multiplying the resistance R of the CPP element by the effective area A of a conductive part of the spin-valve film. In this case, the resistance R can be directly measured and easily determined. On the other hand, the effective area A of the conductive part of the spin-valve film has a value dependent on the element structure. Accordingly, attention must be paid to determination the effective area A.

For example, if the entire spin-valve film is patterned as an effectively sensing part, the effective area A is the area of the entire spin-valve film. In this case, the area of the spin valve film is set to 0.04 μm² or less so as to set an appropriate resistance. For a recording density of 200 Gbpsi or more, the area of the spin valve film is set to 0.02 μm² or less.

If a lower or upper electrode having a smaller area than the spin-valve film is formed in contact with the spin-valve film, however, the effective area A is the area of the lower or upper electrode. If the lower and upper electrodes have different areas, the area of the smaller electrode is the effective area A of the spin-valve film. In this case, the area of the smaller electrode is set to 0.04 μm² or less so as to set an appropriate resistance.

Figure 13:
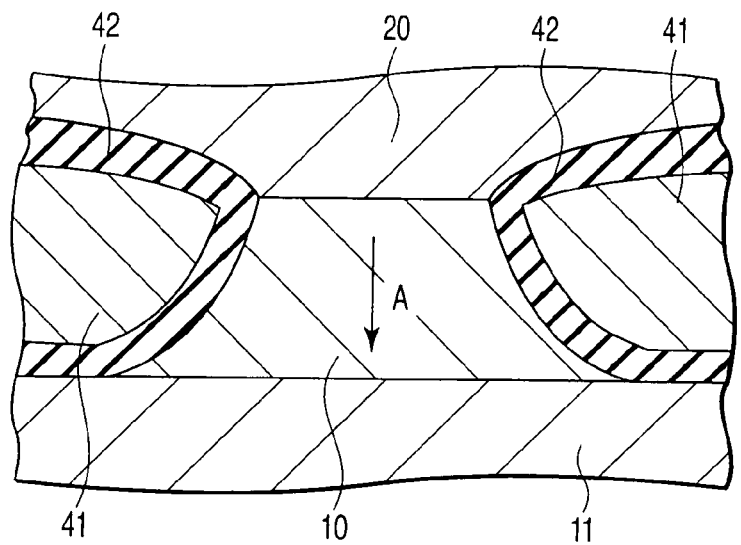
FIG. 13 is a cross-sectional view of a magnetic head according to an embodiment of the present invention.
Figure 14:
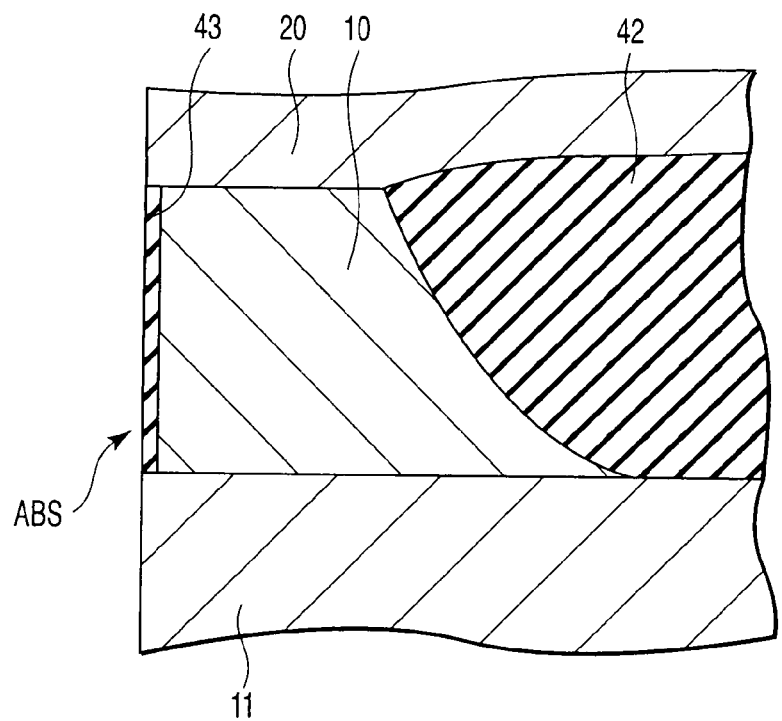
FIG. 14 is a cross-sectional view of a magnetic head according to an embodiment of the present invention.

An example of determining the effective area A will be described with reference to FIGS. 13 and 14, which will be described in more detail later. The smallest area of the spin-valve film 10 shown in FIG. 13 is that of a part where the film 10 is in contact with the upper electrode 20. The width of this part is considered as the track width Tw. The smallest height of the spin-valve film 10 shown in FIG. 14 is also that of a part where the film 10 is in contact with the upper electrode 20. The height of this part is considered as the height length D. In this case, the effective area A is determined as: A=Tw×D.

In the magnetoresistive element according to the embodiment of the present invention, the resistance R between the electrodes can be set to 100Ω or less. The resistance R is a value measured, for example, between two electrode pads in a read head installed to the tip of a head gimbal assembly (HGA).

The magnetoresistive element according to the embodiment of the present invention desirably has an fcc (111) orientation if the pinned layer or free layer has the fcc structure. The magnetoresistive element desirably has a bcc (110) orientation if the pinned layer or free layer has the bcc structure. The magnetoresistive element desirably has an hcp (001) or (110) orientation if the pinned layer or free layer has the hcp structure.

The crystal orientation of the magnetoresistive element according to the embodiment of the present invention preferably has a dispersion angle of 4.0° or less, more preferably 3.5° or less, still more preferably 3.0° or less. This value is obtained by measuring a full width at half maximum of a rocking curve at a peak position obtained by θ-2θ measurement in X-ray diffraction. In a magnetic head, this value can be detected as a dispersion angle of a nano-diffraction spot in a cross section. Although depending on the material for the antiferromagnetic film, the lattice spacing of the antiferromagnetic film is generally different from that of the pinned layer, spacer layer, and free layer. Consequently, the orientation dispersion angle can be separately calculated for each layer. For example, the lattice spacing of platinum manganese (PtMn) is often different from that of the pinned layer, spacer layer, and free layer. Since the platinum manganese (PtMn) is made in a relatively thick film, it is a suitable material for measuring dispersion in crystal orientation. For the pinned layer, spacer layer, and free layer, the pinned layer and the free layer may have different crystal structures such as the bcc and fcc structures. Consequently, the pinned layer and the free layer have different crystal orientation dispersion angles.

(Embodiments of Magnetic Head)

FIGS. 13 and 14 show the magnetoresistive element according to the embodiment of the present invention which is incorporated in a magnetic head. FIG. 13 is a cross-sectional view of the magnetoresistive element taken along a direction substantially parallel to the air bearing surface facing a magnetic recording media (not shown). FIG. 14 is a cross-sectional view of the magnetoresistive element taken along a direction perpendicular to the air bearing surface (ABS).

The magnetic head shown in FIGS. 13 and 14 have a so-called hard abutted structure. The magnetoresistive film 10 is an aforementioned CCP-CPP film. The lower electrode 11 and the upper electrode 20 are provided under and over the magnetoresistive film 10, respectively. In FIG. 13, bias field application films 41 and insulating films 42 are stacked on the both sides of the magnetoresistive film 10. As shown in FIG. 14, a protective layer 43 is provided in the air bearing surface of the magnetoresistive film 10.

A sense current for the magnetoresistive film 10 is supplied by the electrodes 11 and 20 perpendicularly to the plane as shown by arrow A, the electrodes 11 and 20 being arranged under and over the magnetoresistive film 10. Further, the pair of bias field application films 41, 41, provided on the both sides of the magnetoresistive film 10, applies a bias field to the magnetoresistive film 10. The bias field controls the magnetic anisotropy of the free layer in the magnetoresistive film 10 to make the free layer into a single domain. This stabilizes the domain structure of the free layer. It is thus possible to suppress Barkhausen noise associated with movement of magnetic domain walls.

The present invention improves the MR ratio of the magnetoresistive element. Accordingly, the application of the present invention to a magnetic head enables sensitive magnetic reproduction.

(Embodiments of Hard Disk and Head Gimbal Assembly)

The magnetic head shown in FIGS. 13 and 14 may be incorporated in a read/write integrated magnetic head assembly, which can then be mounted in a magnetic recording apparatus.

Figure 15:
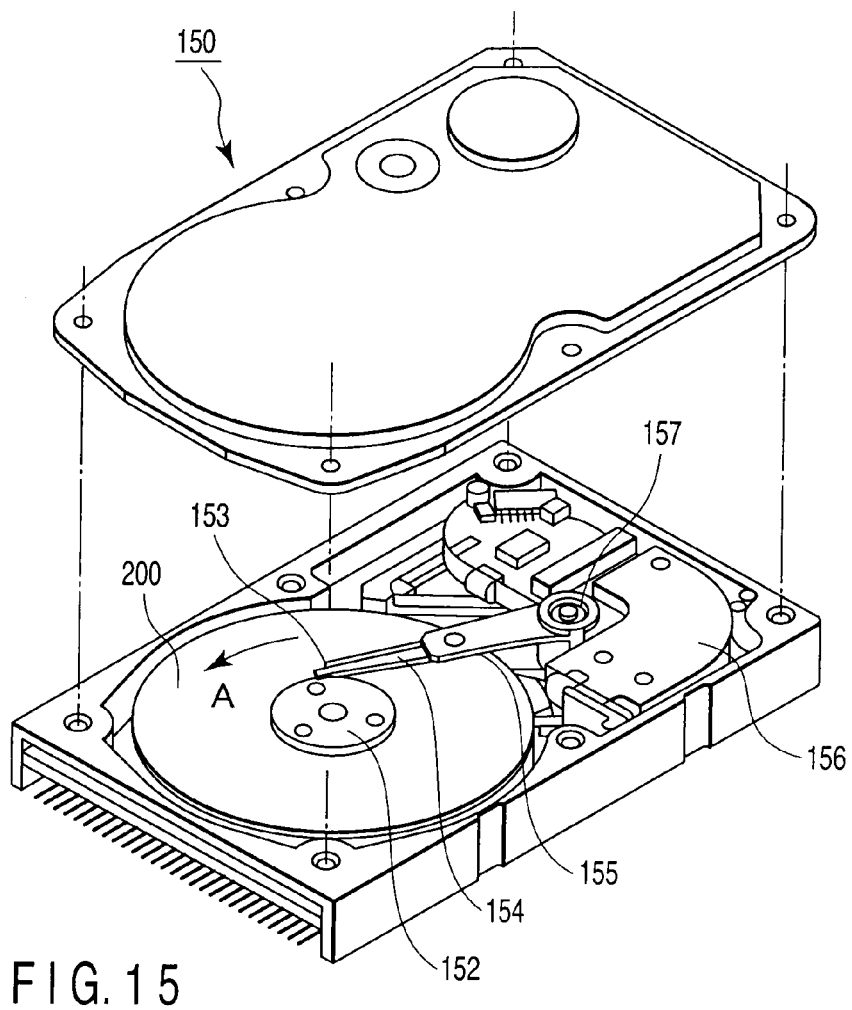
FIG. 15 is a perspective view of a magnetic recording apparatus according to an embodiment of the present invention.

FIG. 15 is a perspective view schematically showing the configuration of a major portion of such a magnetic recording apparatus. A magnetic recording apparatus 150 is of a type using a rotary actuator. In this figure, a magnetic disk 200 is installed on a spindle 152. The magnetic disk 200 is rotated in the direction of arrow A by a motor (not shown) that responds to control signals from a drive controller (not shown). The magnetic recording apparatus 150 according to the present invention may comprise a plurality of disks 200.

A head slider 153 is attached to the tip of a suspension 154 to read from and write to the magnetic disk 200. The head slider 153 has a magnetic head mounted near the tip thereof and including the magnetoresistive element according to any of the above embodiments.

When the magnetic disk 200 rotates, the air bearing surface (ABS) of head slider 153 is held so as to float on the surface of the magnetic disk 200 by a predetermined height. The head slider 153 may be of a so-called in-contact type contacting to the magnetic disk 200.

The suspension 154 is connected to one end of an actuator arm 155. A voice coil motor 156, a kind of linear motor, is provided on the other end of the actuator arm 155. The voice coil motor 156 forms a magnetic circuit including a driving coil (not shown) wound around a bobbin and a permanent magnet and a counter yoke arranged opposite each other so as to sandwich the coil therebetween.

The actuator arm 155 is held by ball bearings (not shown) provided at two vertical positions of the pivot 157. The actuator arm 155 can be rotatably slid by the voice coil motor 156.

Figure 16:
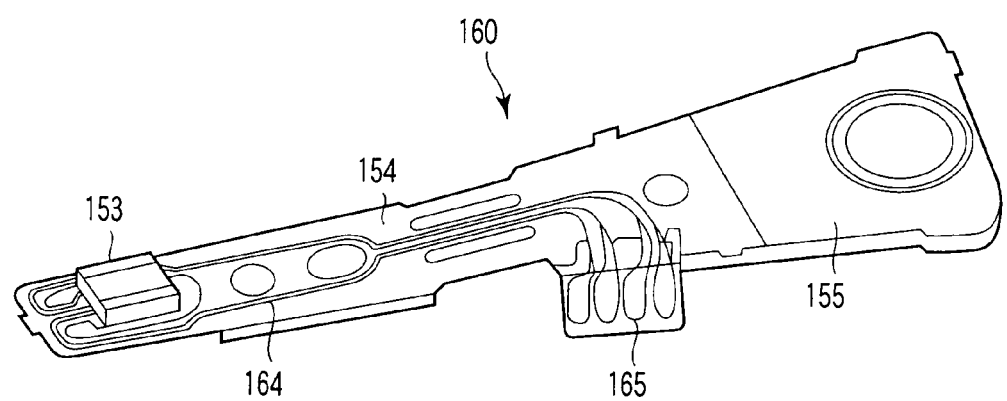
FIG. 16 is a perspective view of a magnetic head assembly according to an embodiment of the present invention.

FIG. 16 is an enlarged perspective view of a part of the head gimbal assembly including tip end side of the actuator arm 155, which is viewed from the disk. The assembly 160 has the actuator arm 155, and the suspension 154 is connected to one end of the actuator arm 155. The head slider 153 is attached to the tip of the suspension 154, and the head slider 153 comprises a magnetic head including the magnetoresistive element according to any of the above embodiments. The suspension 154 has leads 164 used to write and read signals. The leads 164 are electrically connected to respective electrodes in the magnetic head incorporated in the head slider 153. Reference numeral 165 in the figure denotes electrode pads of the assembly 160.

The present invention comprises the magnetic head including the magnetoresistive element according to any of the above embodiments of the present invention. This makes it possible to reliably read information magnetically recorded on the magnetic disk 200 at a recording density higher than that in the prior art.

(Embodiments of Magnetic Memory)

A magnetic memory using the magnetoresistive element according to an embodiment of the present invention will now be described. That is, the magnetoresistive element according to any of the above embodiments of the present invention makes it possible to provide a magnetic memory, for example, a magnetic random access memory (MRAM) in which memory cells are arrayed in a matrix.

FIG. 17 is a diagram showing an example of the matrix configuration of a magnetic memory according to an embodiment of the present invention. This figure shows the circuit configuration in which memory cells are arrayed. The magnetic memory comprises a column decoder 350 and a row decoder 351 to select one bit in the array. A bit line 334 and a word line 332 are used to turn on and uniquely select a switching transistor 330. Detection by a sense amplifier 352 enables reading of the bit information recorded in the magnetic recording layer (free layer) in the magnetoresistive element 10. To write bit information, a current is passed through a particular word line 323 and a particular bit line 322 to generate a magnetic field to be applied.

FIG. 18 is a diagram showing another example of the matrix configuration of a magnetic memory according to an embodiment of the present invention. In this case, one of bit lines 322 is selected by a decoder 361, while one of the word lines 334 is selected by a decoder 360; the bit lines 322 and the word lines 334 are arrayed in a matrix. Thus, a particular memory cell in the array is selected. Each memory cell has a structure in which the magnetoresistive element 10 and a diode D are connected in series. Here, the diode D serves to prevent a sense current from bypassing in the memory cells except the selected magnetoresistive element 10. A write operation is performed by using a magnetic field generated by passing a write current through each of a particular bit line 322 and a particular word line 323.

Figure 19:
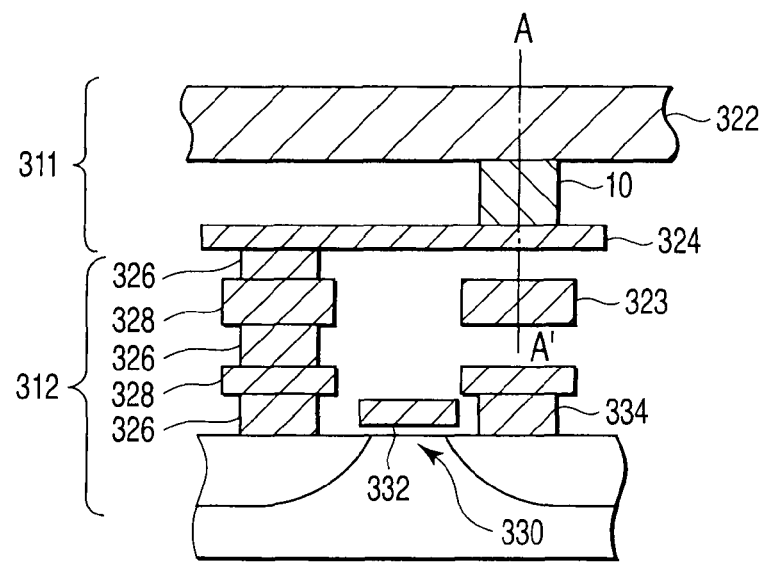
FIG. 19 is a cross-sectional view showing a major portion of a magnetic memory according to an embodiment of the present invention.
Figure 20:
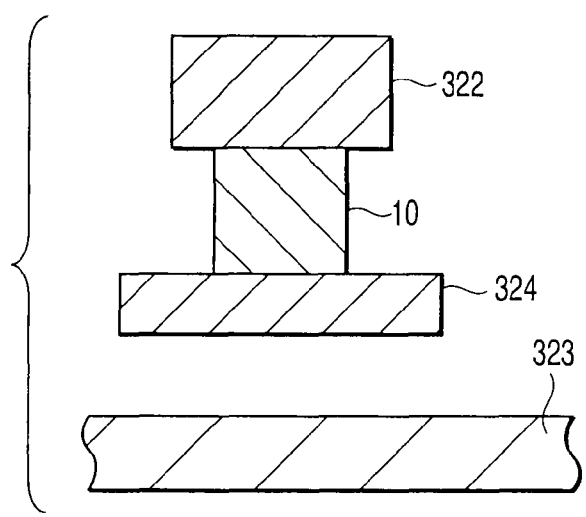
FIG. 20 is a cross-sectional view of the magnetic memory taken along the line A-A' in FIG. 19.

FIG. 19 is a cross-sectional view showing a major portion of a magnetic memory according to an embodiment of the present invention. FIG. 20 is a cross-sectional view taken along the line A-A' in FIG. 19. The structure shown in these figures corresponds to a memory cell for one bit included in the magnetic memory shown in FIG. 17 or 18. The memory cell has a storage element 311 and an address selecting transistor 312.

The storage element 311 has the magnetoresistive element 10 and a pair of wires 322 and 324 connected to the magnetoresistive element 10. The magnetoresistive element 10 is any CCP-CPP element of the above embodiments.

On the other hand, the selecting transistor 312 is provided with a transistor 330 connected to the magnetoresistive element 10 through vias 326 and buried wires 328. The transistor 330 performs a switching operation in accordance with a voltage applied to a gate 332 to controllably open and close the current paths between the magnetoresistive element 10 and a wire 334.

A write wire 323 is provided below the magnetoresistive element 10 in a direction orthogonal to the wire 322. The write wires 322 and 323 can be formed of, for example, aluminum (Al), copper (Cu), tungsten (W), tantalum (Ta), or an alloy of these elements.

In the memory configured as described above, to write bit information to the magnetoresistive element 10, a write pulse current is passed through the wires 322 and 323 to induce a synthetic field. The synthetic field is applied to appropriately reverse the magnetization of the recording layer of the magnetoresistive element.

Further, to read bit information, a sense current is passed through the wire 322, the magnetoresistive element 10 including the magnetic recording layer, and the lower electrode 324. Then, the resistance value or a resistance change of the magnetoresistive element 10 is measured.

The magnetic memory according to the embodiment of the present invention uses the magnetoresistive element (CCP-CPP element) according to any of the above embodiments. Consequently, even with a reduction in cell size, the magnetic domains in the recording layer are surely controlled to allow write and read operations to be reliably performed.

The embodiments of the present invention have been described with reference to the specific examples. However, the present invention is not limited to these specific examples. For example, for the specific structure of the magnetoresistive element as well as the shapes and materials of the electrodes, bias application film, insulating film, and the like, those skilled in the art can similarly implement the present invention to produce similar effects by making appropriate selections from the corresponding well-known ranges.

For example, when the magnetoresistive element is applied to a read magnetic head, the detection resolution of the magnetic head can be defined by providing magnetic shields on both sides of the element.

Further, the present invention can be applied to a magnetic head or magnetic recording apparatus based on a perpendicular magnetic recording system as well as a longitudinal magnetic recording system, and can produce similar effects in any system.

Moreover, the magnetic recording apparatus according to the present invention may be a so-called a rigid type constantly provided with particular recording media or a removable type that allows recording media to be exchanged.

The scope of the present invention also includes all the magnetoresistive elements, magnetic heads, magnetic recording apparatuses, and magnetic memories that can be implemented by those skilled in the art by appropriately changing the designs of the above magnetic heads and magnetic recording apparatuses described above as the embodiments of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a magnetoresistive element including a magnetization pinned layer with a magnetization direction substantially pinned in one direction, a magnetization free layer with a magnetization direction that varies depending on an external field, and a spacer layer including an insulating layer provided between the magnetization pinned layer and the magnetization free layer and current paths penetrating into the insulating layer, the method comprising:
   (a) depositing a first metal layer including a first element on the magnetization pinned layer or the magnetization free layer, the first element forming current paths of the spacer layer;
   (b) depositing a second metal layer including a second element that is more easily oxidized than the first element on the first metal layer;
   (c) supplying an oxidation gas or a nitriding gas while irradiating the second metal layer with an ion beam or a RF plasma of a rare gas so as to convert the second element into the insulating layer of the spacer layer; and
   (d) performing an ion-beam treatment or a RF plasma of a rare gas after the supplying (c) to enhance separation of the insulating layer and the current paths.

2. The method according to claim 1, further comprising:
   (e) performing a pretreatment of irradiating the second metal layer with an ion beam or a RF plasma of rare gas prior to the supplying (c).

3. The method according to claim 2, wherein the pretreatment is performed with an acceleration voltage for the ion beam or the RF plasma of the rare gas setting to 30 V or more and 130 V or less.

4. The method according to claim 2, wherein the pretreatment is performed with an acceleration voltage for the ion beam or the RF plasma of the rare gas setting to 40 V or more and 60 V or less.

5. The method according to claim 1, wherein the first metal layer includes at least one element selected from the group consisting of Cu, Au, and Ag.

6. The method according to claim 1, wherein the first metal layer has a thickness of 0.1 nm or more and 1 nm or less.

7. The method according to claim 1, wherein the insulating layer is an oxide or a nitride including at least one element selected from the group consisting of Al, Si, Hf, Ti, Ta, Mo, W, Nb, Mg, Cr, and Zr.

8. The method according to claim 1, wherein the second metal layer has a thickness of 0.5 nm or more and 2 nm or less.

9. The method according to claim 1, wherein the current paths have a diameter of 2 nm or more and 6 nm or less.

10. The method according to claim 1, wherein the magnetization pinned layer has a body-centered cubic structure at an interface with the spacer layer.

11. The method according to claim 1, wherein the magnetization pinned layer comprises a $Fe_xCo_{100-x}$ alloy layer, whereby $x \geq 30$ atomic %.

12. The method according to claim 1, further comprising:
(e) forming a Cu layer on the spacer layer.

* * * * *